US008836551B2

(12) United States Patent  
Nozaki

(10) Patent No.: US 8,836,551 B2  
(45) Date of Patent: Sep. 16, 2014

(54) ANALOG DIGITAL CONVERTER (ADC) AND CORRECTION CIRCUIT AND CORRECTION METHOD THEREFOR

(71) Applicant: Fujitsu Semiconductor Limited, Yokohama (JP)

(72) Inventor: Takeshi Nozaki, Sagamihara (JP)

(73) Assignee: Fujitsu Semiconductor Limited, Yokohama (JP)

( * ) Notice: Subject to any disclaimer, the term of this patent is extended or adjusted under 35 U.S.C. 154(b) by 13 days.

(21) Appl. No.: 13/790,815

(22) Filed: Mar. 8, 2013

(65) Prior Publication Data

US 2013/0241753 A1      Sep. 19, 2013

(30) Foreign Application Priority Data

Mar. 13, 2012   (JP) .................................. 2012-055489

(51) Int. Cl.  
    *H03M 1/06*    (2006.01)  
    *H03M 1/08*    (2006.01)  
    *H03M 1/12*    (2006.01)

(52) U.S. Cl.  
    CPC .............. *H03M 1/0626* (2013.01); *H03M 1/06* (2013.01); *H03M 1/0836* (2013.01); *H03M 1/1215* (2013.01)  
    USPC ........... 341/118; 341/155; 341/161; 341/120; 375/232; 375/350

(58) Field of Classification Search  
    CPC ..... H03H 21/011; H03H 21/02; H03H 21/00; H04L 25/061; H04L 25/03057; H04L 25/03038; H04L 25/03611; H04L 25/03503; H03M 1/10; H03M 1/12; H03M 1/38; H03M 1/0626; H03M 1/0838; H03M 1/1215; H03M 1/0624; H03M 1/1028; H03M 1/1225

USPC .......................... 341/118–161; 375/232, 350  
See application file for complete search history.

(56) References Cited

U.S. PATENT DOCUMENTS 6,621,862 B1 * 9/2003 Dabell .......................... 375/229  
6,924,755 B1 * 8/2005 Callanan et al. ............... 341/118  
(Continued)

FOREIGN PATENT DOCUMENTS

JP    2005-348156 A    12/2005  
JP    2008-11189 A    1/2008

OTHER PUBLICATIONS

Shafiq M. Jamal, et al., "A 10-b 120-Msamples/s Time-Interleaved Analog-to-Digital Converter with Digital Backgrond Calibration", IEEE Journal of Solid-State Circuits, Dec. 2002, pp. 1618-1267, vol. 37, No. 12.

(Continued)

*Primary Examiner* — Lam T Mai  
(74) *Attorney, Agent, or Firm* — Arent Fox LLP

(57) ABSTRACT

An ADC has ADC channels converting an analog input signal into an digital output signal in a time interleave manner; a channel combiner combining channel digital signals respectively output by the ADC channels and generate the digital output signal; an adaptive filter provided at one of the plurality of ADC channels; and a correction circuit detecting a skew error in the digital output signal, generating a coefficient of the adaptive filter according to the skew error for setting it in the filter. According to the skew error, in a first setting, the correction circuit sets the coefficient such that the adaptive filter phase-shifts to one direction a phase of the channel digital signal and, in a second setting, the correction circuit sets the coefficient such that the adaptive filter phase-shifts to an opposite direction and sets a coefficient with which the skew error is suppressed to a desired level.

20 Claims, 18 Drawing Sheets

(56) References Cited

U.S. PATENT DOCUMENTS

| | | | |
|---|---|---|---|
| 7,053,804 B1* | 5/2006 | Nairn | 341/118 |
| 7,292,170 B2* | 11/2007 | Kinyua et al. | 341/141 |
| 7,466,250 B2* | 12/2008 | Buisson | 341/120 |
| 7,693,214 B2 | 4/2010 | Shida | |
| 7,834,786 B2* | 11/2010 | Kawahito et al. | 341/120 |
| 2008/0001806 A1 | 1/2008 | Uchino | |
| 2013/0027233 A1* | 1/2013 | Nozaki | 341/118 |

OTHER PUBLICATIONS

Chi Ho Law, et al. "A Four-Channel Time-Interleaved ADC with Digital Calibration of Interchannel Timing and Memory Errors", IEEE Journal Solid-State Circuits, Oct. 2010, vol. 45, No. 10, pp. 2091-2103.

Korean Office Action, KR Patent Application No. 10-2013-0025053 mailed Apr. 22, 2014.

* cited by examiner

Δt: TIMING SKEW

ANALOG INPUT fin

DIGITAL OUTPUT D1, D2

SKEW ERROR dt

STEP 1

STEP 2

ANALOG DIGITAL CONVERTER (ADC) AND CORRECTION CIRCUIT AND CORRECTION METHOD THEREFOR

CROSS-REFERENCE TO RELATED APPLICATION

This application is based upon and claims the benefit of priority of the prior Japanese Patent Application No. 2012-55489, filed on Mar. 13, 2012, the entire contents of which are incorporated herein by reference.

FIELD

The present embodiments relate to an ADC and a correction circuit and a correction method for the ADC.

BACKGROUND

An analog digital converter (ADC) is a circuit that converts an analog input signal into a digital output signal. In order to increase a sampling frequency of analog digital conversion, a time interleave ADC is proposed in which a plurality of ADCs (ADC channels) are provided and the plurality of ADCs convert an analog input signal into a digital output signal in order in a time division manner. The time interleave ADC is described in Japanese Patent Application Laid-Open No. 2005-348156 and Japanese Patent Application Laid-Open No. 2008-11189.

The time interleave ADC enables a high-speed operation. However, when characteristics of the ADCs are different or a relation among timings when the ADCs operate deviates, an S/N ratio sometimes falls. As a method of correcting an error among the ADC channels, foreground calibration and background calibration are proposed. The former requires time for correction other than normal operation time of the ADCs. On the other hand, since the latter performs correction during a normal operation of the ADCs, it corrects, in background, an error caused by aged deterioration, a temperature change, or the like. A background calibration circuit is described in S. M. Jamal, et al., "A 10 b 120 Msample/s Time-Interleaved Analog-to-Digital Converter With Digital Background Calibration", JSSC 2002.

In the background calibration circuit, an adaptive filter is provided in at least one of a plurality of ADC channels that operate in a time interleave (time division) manner. A coefficient of the adaptive filter is calculated on the basis of an added-up output obtained by adding up outputs of the plurality of ADC channels. The coefficient of the adaptive filter is controlled to suppress a spurious signal component of the added-up output. Consequently, a spurious signal component (an error signal component or an image signal component), which is an error (a skew error) caused by deviation (skew) of sampling timing of the time interleave, is suppressed.

However, when a sinc function is used instead of a delta function as the coefficient of the adaptive filter, a desired phase shift control is possible as long as phase shift control is performed at accuracy of a tap of the adaptive filter. However, a characteristic of the adaptive filter has frequency dependency when the phase shift control is performed at accuracy smaller than the accuracy of the tap. Therefore, when an analog input signal has a high frequency, the desired phase shift control is difficult or impossible because of the frequency dependency.

SUMMARY

One aspect of an embodiment is an analog digital converter (hereinafter ADC) that samples an analog input signal at a sampling frequency and converts the analog input signal into a digital output signal, the ADC including:

a plurality of ADC channels configured to convert the analog input signal into the digital output signal in a time interleave manner;

a channel combiner configured to combine channel digital signals respectively output by the plurality of ADC channels and generate the digital output signal;

an adaptive filter provided between an output of at least one of the plurality of ADC channels and the channel combiner; and a correction circuit configured to detect a skew error included in the digital output signal, generate a coefficient of the adaptive filter according to the skew error, and set the coefficient in the adaptive filter, wherein in a first setting, the correction circuit sets, according to the skew error, the coefficient such that the adaptive filter phase-shifts to one direction for advancing or delaying a phase of the channel digital signal and, in a second setting, the correction circuit sets, according to the skew error, the coefficient such that the adaptive filter phase-shifts to an opposite direction to the one direction and sets, in the adaptive filter, a coefficient with which the skew error is suppressed to a desired level.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
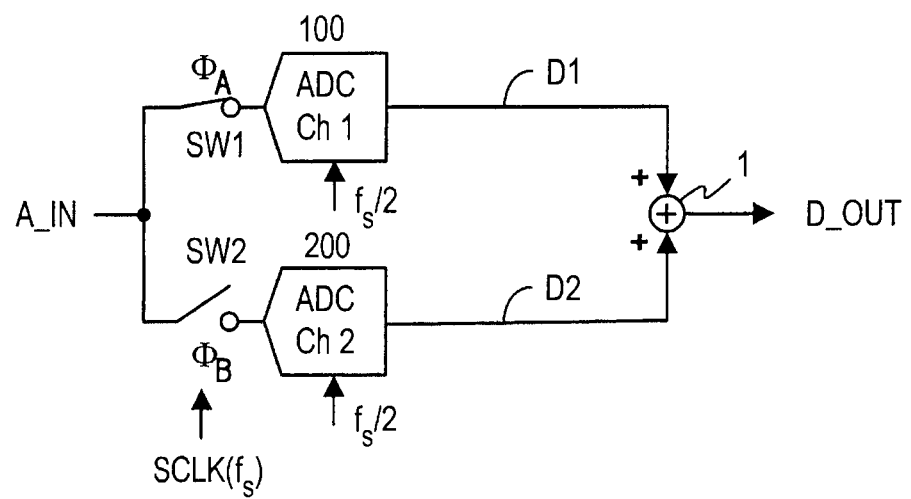
FIG. 1 is a diagram illustrating a time interleave type ADC.

FIG. 1 is a diagram illustrating a time interleave type ADC. The time interleave type ADC includes a plurality of (two in an example illustrated in FIG. 1) ADC channels 100 and 200 configured to convert an analog input signal A_IN into a digital output signal in a time interleave manner and a channel combiner 1 configured to combine channel digital signals D1 and D2 respectively output by the plurality of ADC channels 100 and 200 to generate a digital output signal D_OUT. The channel combiner 1 is, for example, an adder.

The analog input signal A_IN is input to the ADC channels 100 and 200 respectively via switches SW1 and SW2. The switches SW1 and SW2 repeat ON and OFF in a time interleave manner in synchronization with a sampling clock SCLK having a sampling frequency fs. In the example illustrated in FIG. 1, since the ADC includes the two ADC channels, the switches SW1 and SW2 are turned on in synchronization with rising edges (or falling edges) of sampling clocks ΦA and ΦB having a frequency fs/2 obtained by dividing the sampling clock SCLK having the sampling frequency fs by two (by N when the number of channels is N). The switches SW1 and SW2 respectively input the analog input signals A_IN to the ADC channels 100 and 200 corresponding thereto while the sampling clocks ΦA and ΦB are at an H level (or an L level).

The ADC channels 100 and 200 respectively include ADC circuits and convert the analog input signal A_IN into digital signals D1 and D2. The ADC circuits included in the ADC channels perform AD conversion at a period of a frequency fs/2 obtained by dividing the sampling clock SCLK of the sampling frequency fs by two, i.e., at a period 2/fs twice as long as the period of the sampling frequency fs. Therefore, the ADC circuits of the ADC channels only have to perform the AD conversion at a period twice as long as a sampling period.

Figure 2:
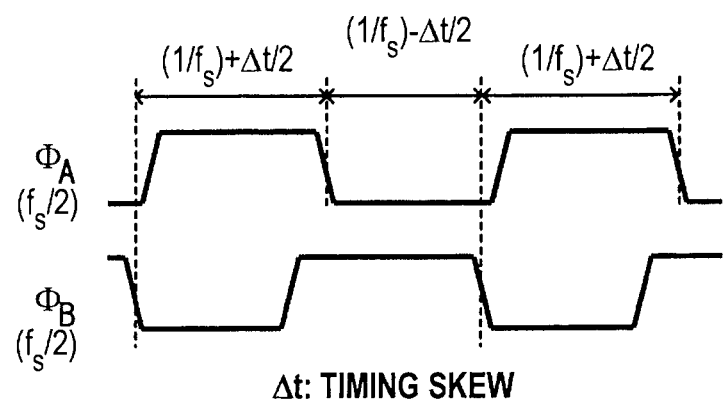
FIG. 2 is a diagram illustrating an example of the frequency-divided sampling clocks ΦA and ΦB.

FIG. 2 is a diagram illustrating an example of the frequency-divided sampling clocks ΦA and ΦB. Ideally, an ON duty ratio of the sampling clock ΦA is 50%. However, as illustrated in FIG. 2, when a period of the H level is 1/fs+Δt/2 and a period of the L level is 1/fs−Δt/2, timing of a rising edge of the sampling clock ΦB, a phase of which is inverted from a phase of the sampling clock ΦA, is earlier than ideal timing 1/fs by −Δt/2. A skew error occurs in the AD-converted channel digital output signals D1 and D2 because of such deviation (skew) of the sampling timing of the ADCs.

Figure 3A:
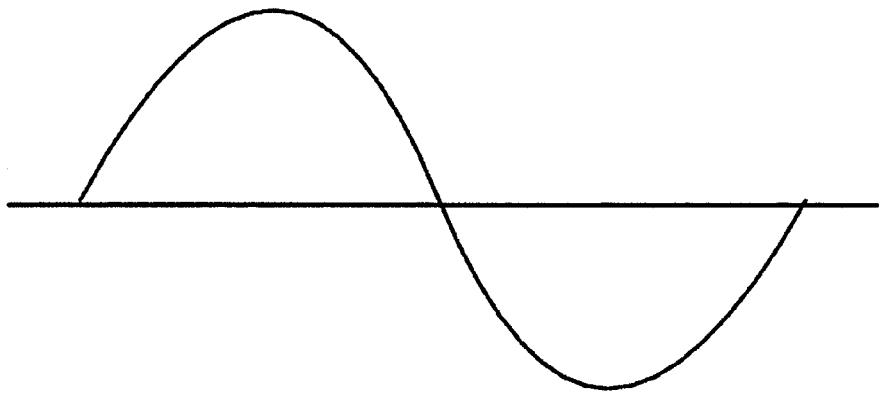
FIGS. 3A to 3C are diagrams illustrating a skew error.
Figure 3B:
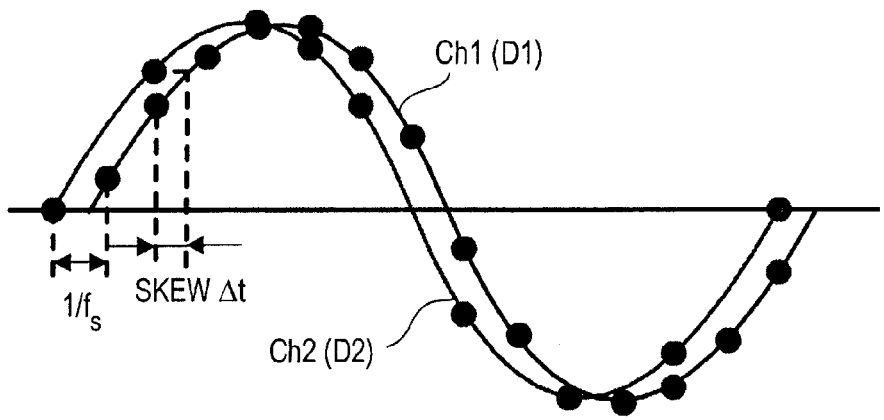
Figure 3C:
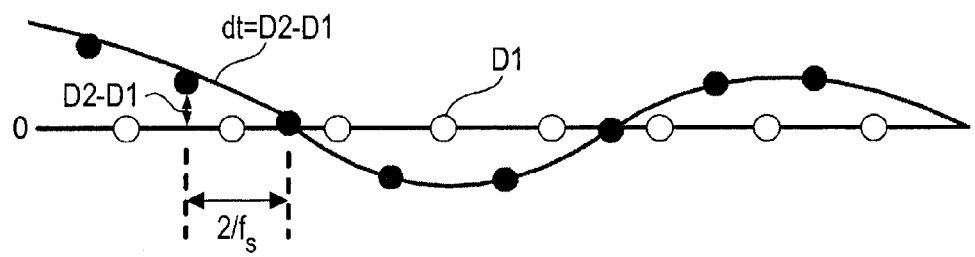

FIGS. 3A to 3C are diagrams illustrating a skew error. An analog input signal fin is illustrated in FIG. 3A. The sampling timing of the period 1/fs and digital output signals D1, D2 AD-converted by the ADC channels 100 and 200 are illustrated in FIG. 3B. As an example, the analog input signal A_IN is a sine wave or a cosine wave. As illustrated in FIG. 2, when a skew Δt is present between sampling timings of both the channels, the other ADC channel is sampled at timing deviating from timing just in the middle of the sampling timing of one ADC channel. As a result, as illustrated in FIG. 3B, when the digital output signals D1 and D2 of both the ADC channels are seen at the sampling timing of the period 1/fs, the digital output signals D1 and D2 have a phase difference corresponding to the skew Δt.

In an example illustrated in FIG. 3B, the digital output signal D1 on the ADC channel 100 side has a phase later than a phase of the digital output signal D2 on the ADC channel 200 side.

As a result, when the digital output signals D1 and D2 are combined by the combiner 1, a combined digital output signal D_OUT has a skew error dt illustrated in FIG. 3C with respect to the original analog input signal A_IN. The skew error dt is a difference D2−D1 between the digital output signals D1 and D2. As the skew Δt is larger, the amplitude of the skew error dt is larger. When the skew Δt of the sampling clocks is zero, the phases of the digital output signals D1 and D2 illustrated in FIG. 3B coincide with each other. The skew error dt illustrated in FIG. 3C is zero at all the sampling timings.

As explained above, a difference between waveforms of the two digital outputs D1 and D2 is an error caused by the skew of the sampling clocks, i.e., a skew error. The difference is included in the digital output signal D_OUT obtained by combining the outputs of the two ADC channels. In a value obtained by sampling and AD-converting the digital output D1, a skew error is zero as indicated by white circles on the abscissa in FIG. 3C. However, a value obtained by sampling and AD-converting the digital output D2 has an error corresponding to the difference D2−D1 of the digital outputs D2 and D1 as indicated by black circles in FIG. 3C. In other words, the combined digital output signal D_OUT includes an image signal component (a spurious component) due to the skew error, which is the difference between the digital outputs D1 and D2 at the sampling clock ΦB, in addition to an analog input signal component (a value of the digital output D1).

As illustrated in FIG. 3C, the skew error occurs at every period 2/fs of the sampling clock ΦB (frequency fs/2). The skew error has a value corresponding to a value of an envelope of a period 1/fin of the analog input signal (a waveform of D1). A phase of the skew error shifts by π/2 from the phase of the analog input signal. Therefore, the image signal component due to the skew error is a waveform having a high frequency fs/2, which is a half of the sampling frequency fs and a low frequency of a frequency fin of the analog input signal (the waveform of D1). A frequency of the image signal component is fs/2−fin.

Figure 4:
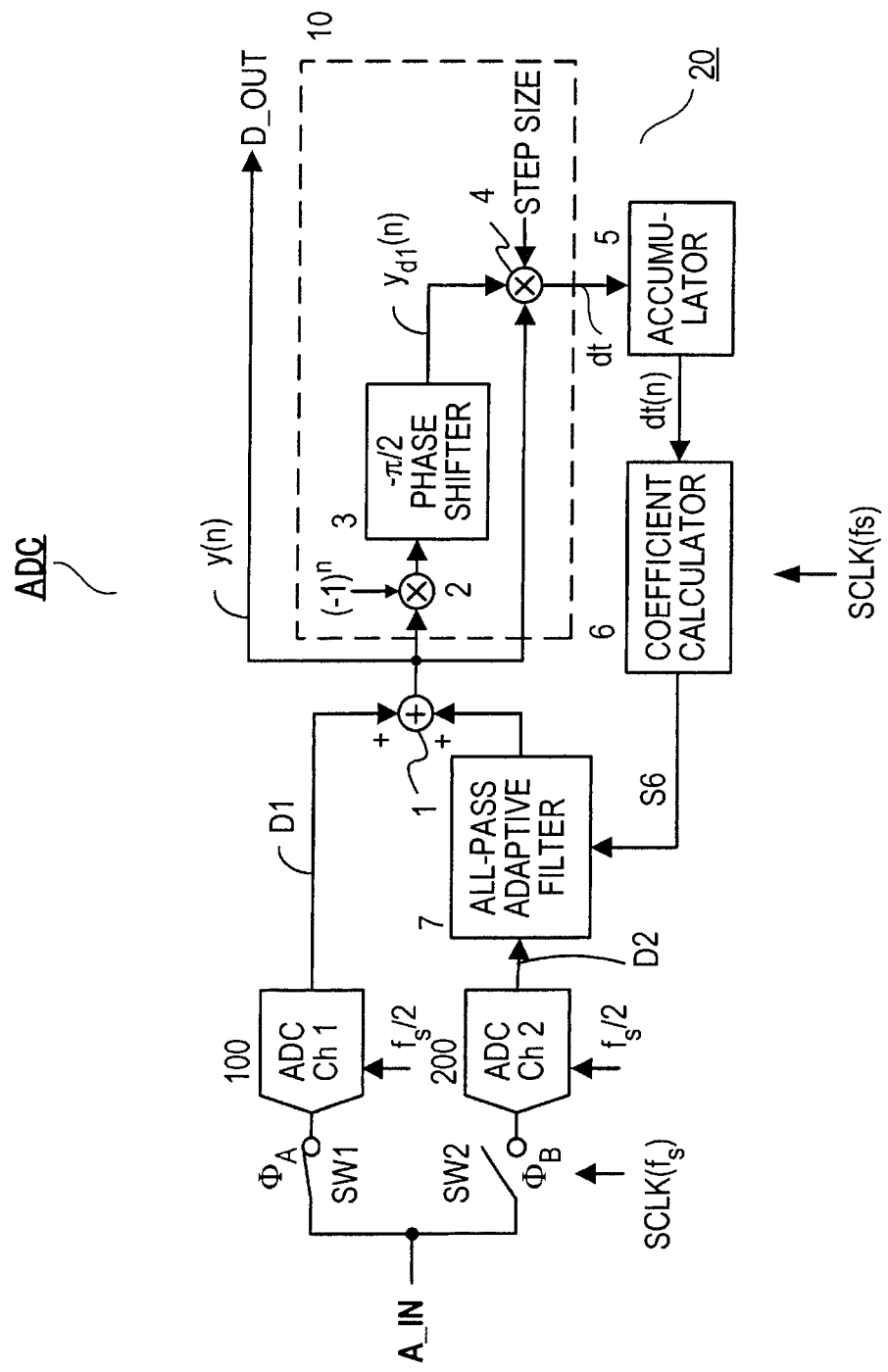
FIG. 4 is a diagram illustrating an example of an ADC of the time interleave type.

FIG. 4 is a diagram illustrating an example of an ADC of the time interleave type. This example is an ADC that calibrates an image signal component, which is a skew error, on the background. This example is also an example including the two ADC channels 100 and 200.

Like the ADC illustrated in FIG. 1, the ADC of the time interleave type illustrated in FIG. 4 includes the two ADC channels 100 and 200 and the adder 1 configured to combine the digital outputs D1 and D2 of the ADC channels 100 and 200. Further, the ADC includes an adaptive filter 7 for performing a phase shift for advancing or delaying the phase of the digital output D2 of the ADC 200 of the second channel.

The ADC illustrated in FIG. 4 includes a correction circuit 20. The correction circuit 20 detects a skew error from the digital output signal D_OUT combined by the adder 1, and generates a coefficient S6 of the adaptive filter 7 so as to perform a phase shift according to the skew of the digital output D2, and suppress or eliminate the skew error of the combined digital output signal D_OUT. The correction circuit 20 includes a skew-error detecting circuit 10 configured to detect a skew error from the combined digital output signal D_OUT, an accumulator 5 configured to generate an average dt(n) of the skew error, and a coefficient calculator 6 configured to generate the coefficient S6 of the adaptive filter 7 on the basis of the average dt(n) of the skew error.

Specifically, as illustrated in FIGS. 3A to 3C, the skew error dt occurs at the period 2/fs twice as long as the sampling period 1/fs and fluctuates at an amplitude proportional to the magnitude of the skew Δt. Therefore, the correction circuit 20 calculates the average dt(n) (also referred to as skew error estimated amount) of the skew error as a value corresponding to the skew Δt and sets, in the adaptive filter 7, the coefficient S6 for suppressing the average dt(n) of the skew error. In other words, the correction circuit 20 sets, in the adaptive filter 7, the coefficient S6 for performing a phase shift corresponding to the skew Δt illustrated in FIG. 3B.

More specifically, the correction circuit 20 calculates the skew error estimated amount dt(n) from the digital output signal D_OUT using the skew-error detecting circuit 10 and the accumulator 5 and calculates the filter coefficient S6 on the basis of the estimated amount using the coefficient calculator 6. In the skew error estimated amount dt(n), n represents the number of times of sampling. The adaptive filter 7 corrects the digital output D2 of the second ADC channel 200 to a digital value of a phase-shifted signal according to the filter coefficient S6. The correction circuit 20 calculates the skew error estimated amount dt(n) again from the digital output signal D_OUT obtained as a result of the correction and calculates the filter coefficient S6. The correction circuit 20 repeats such processing until the skew error estimated amount dt(n) becomes asymptotic to near zero, whereby the skew error is corrected.

Figure 5A:
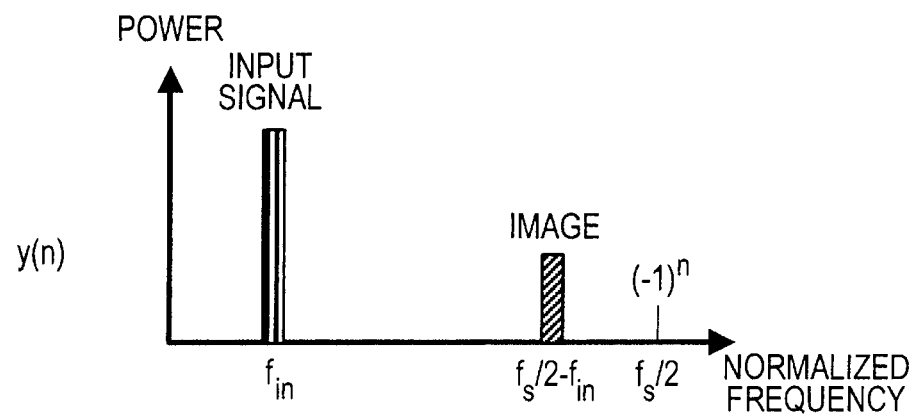
FIGS. 5A and 5B are diagrams for explaining the skew-error detecting circuit 10.
Figure 5B:
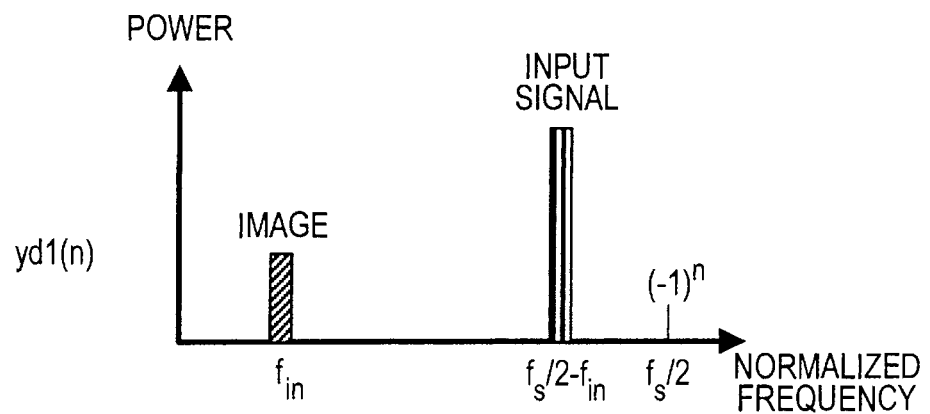

FIGS. 5A and 5B are diagrams for explaining the skew-error detecting circuit 10. In FIG. 5A, an analog input signal component (frequency fin) and an image component (frequency fs/2−fin) due to a skew error are illustrated with a normalized frequency plotted on the abscissa and power plotted on the ordinate.

The skew-error detecting circuit 10 includes a frequency shift circuit 2 configured to multiply the combined digital output signal D_OUT (or y(n)) with a signal $(-1)^n$, a sign of which is inverted to +1, −1, +1, and −1 at every sampling timing n. The signal $(-1)^n$ is a signal that changes at the period 2/fs twice as long as the sampling period 1/fs. A frequency of the signal $(-1)^n$ is fs/2.

Therefore, the frequency shift circuit 2 is a kind of mixer circuit including a multiplication circuit. Therefore, in an output yd1(n) of the frequency shift circuit 2, as illustrated in FIG. 5B, an image component of the frequency fs/2−fin is shifted to the frequency fin, which is a difference between the frequency fs/2−fin and the frequency fs/2 of the signal $(-1)^n$. An input signal of the frequency fin is shifted to the frequency fs/2−fin, which is a difference between the frequency fin and the frequency fs/2 of the signal $(-1)^n$.

Further, as illustrated in FIG. 3C, phases of the input signal fin and a signal of the image component (a skew error signal) deviate by π/2. Therefore, the skew-error detecting circuit 10 includes a phase shift circuit 3 configured to shift a phase of an output of the frequency shift circuit 2 by −π/2. According to the −π/2 shift by the phase shift circuit 3, the input signal component and the image component of the combined digital output signal y(n) illustrated in FIG. 5A change to signals, phases of which are the same or inverted. The same applies to an image component and an input signal component of the output signal yd1(n) of the phase shift circuit 3 illustrated in FIG. 5B.

In short, as explained with reference to FIGS. 3B and 3C, a signal obtained by shifting the skew error dt by −π/2 has a phase opposite to or the same as the phase of the input signal D2 depending on whether a phase of an ADC channel Ch2 side is delayed or advanced with respect to a Ch1 side.

Therefore, the multiplier 4 in the skew-error detecting circuit 10 multiplies together the combined digital output signal y(n) and the output signal yd1(n) of the phase shift circuit 3, and outputs a value obtained by adding up a multiplication value of the input signal component (fin) of the combined digital output signal y(n) and the image component (fin) of the output signal yd1(n) of the phase shift circuit 3, and a multiplication value of the image component (fs/2−fin) of the combined digital output signal y(n) and the input signal component (fs/2−fin) of the output signal yd1(n) of the phase shift circuit 3. As a result, the multiplier 4 outputs a value proportional to the amplitude of the image component. Moreover, the polarity of the skew error dt of the output of the multiplier 4 is opposite depending on whether a phase of the ADC channel Ch2 side is delayed or advanced with respect to the Ch1 side. Since frequencies of the multiplied signals coincide with each other, the output does not include a frequency component.

Although the output dt of the multiplier 4 has a value corresponding to the skew error, the skew error fluctuates as illustrated in FIG. 3C. Therefore, the accumulator 5 in the correction circuit 20 integrates and averages the output of the multiplier 4 and removes an AC component of the output. Therefore, the average dt(n) of the skew error output by the accumulator 5 is an average updated at every sampling timing and is a value corresponding to the magnitude of the skew Δt. The average dt(n) of the skew error indicates the direction of the skew as polarity.

Finally, in synchronization with the sampling clock SCLK (fs), a coefficient calculating circuit 6 calculates, on the basis of the average dt(n) of the skew error corresponding to the magnitude of the skew, the coefficients S6 for setting a phase shift amount of the adaptive filter 7 to suppress the skew error and sets the coefficient S6 in the adaptive filter 7. This feedback control is repeated in synchronization with the sampling clock (or a clock obtained by dividing the sampling clock), whereby the average dt(n) of the skew error is suppressed to be close to zero.

A step size is given to the multiplier 4 as a coefficient. The step size is a coefficient for controlling the speed of the feedback control. When the step size is large, although the feedback control settles faster, overshoot and undershoot also increase. When the step size is small, although overshoot and undershoot decrease, the feedback control settles slowly.

Figure 6:
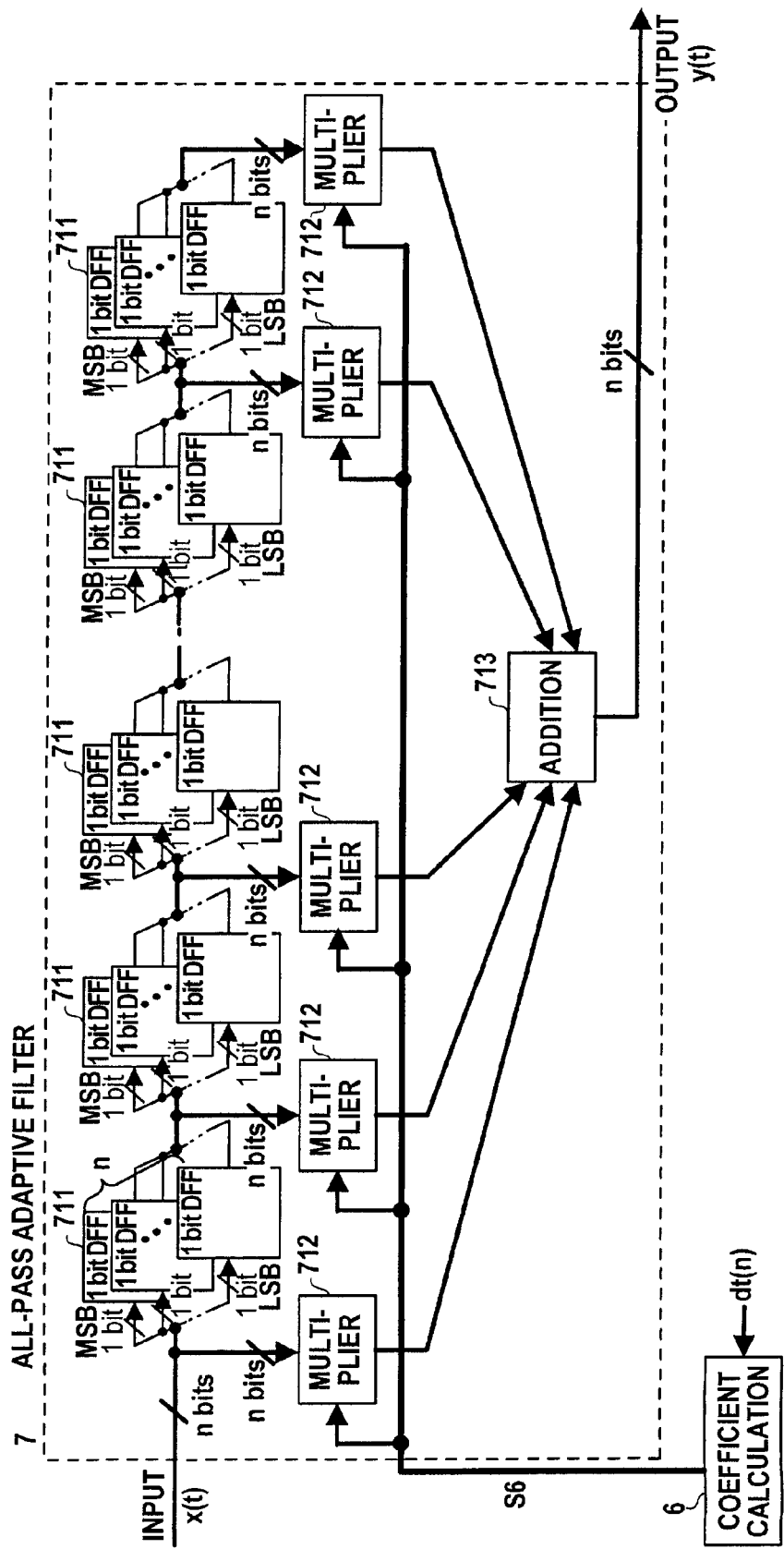
FIG. 6 is a circuit diagram of the adaptive filter 7.

FIG. 6 is a circuit diagram of the adaptive filter 7. The adaptive filter 7 outputs an output digital signal y(t) obtained by correcting an n-bit input digital signal x(t) to a desired waveform according to the coefficient S6. In this embodiment, the adaptive filter 7 outputs the output digital signal y(t) obtained by shifting a phase of the input digital signal x(t) by a desired phase shift amount according to the coefficient S6. This phase shift amount of the adaptive filter 7 is a correction amount.

The adaptive filter 7 includes a plurality of delay circuits 11 including, by the number of bits, delay flip-flops DFF for delaying the input digital signal x(t) by one clock. Further, the adaptive filter 7 includes a plurality of multipliers 712 including input nodes and output nodes of the delay circuits 711 as taps and configured to respectively multiply digital values of the taps and the coefficient S6 output by the coefficient calculating circuit 6 and set in the taps, and an adder 713 configured to add up outputs of the multipliers 712. A digital output of the adder 713 is an output digital signal y(t). The adaptive filter 7 illustrated in FIG. 6 is a higher-order filter as the number of taps is larger.

Figure 7A:
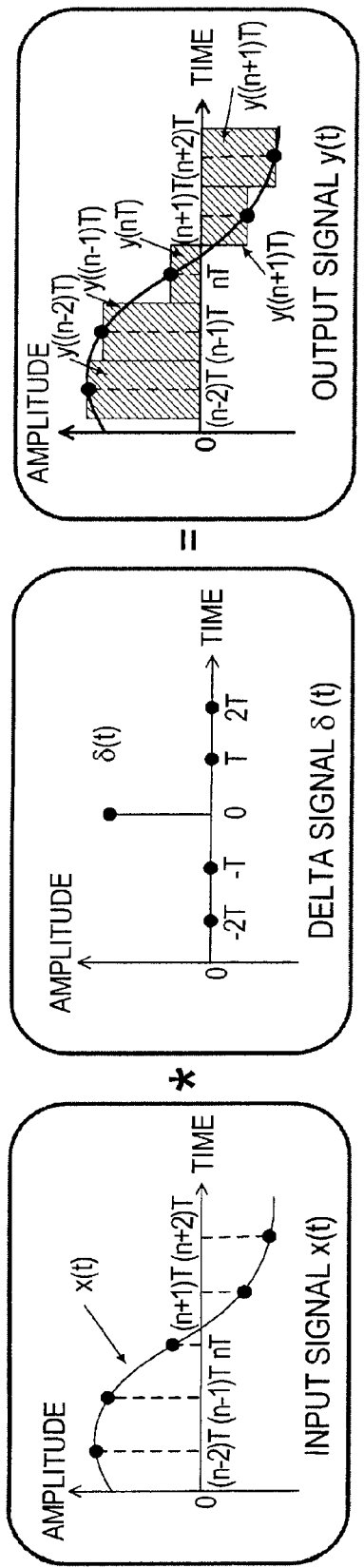
FIGS. 7A and 7B are diagrams illustrating the operation of the adaptive filter.
Figure 7B:
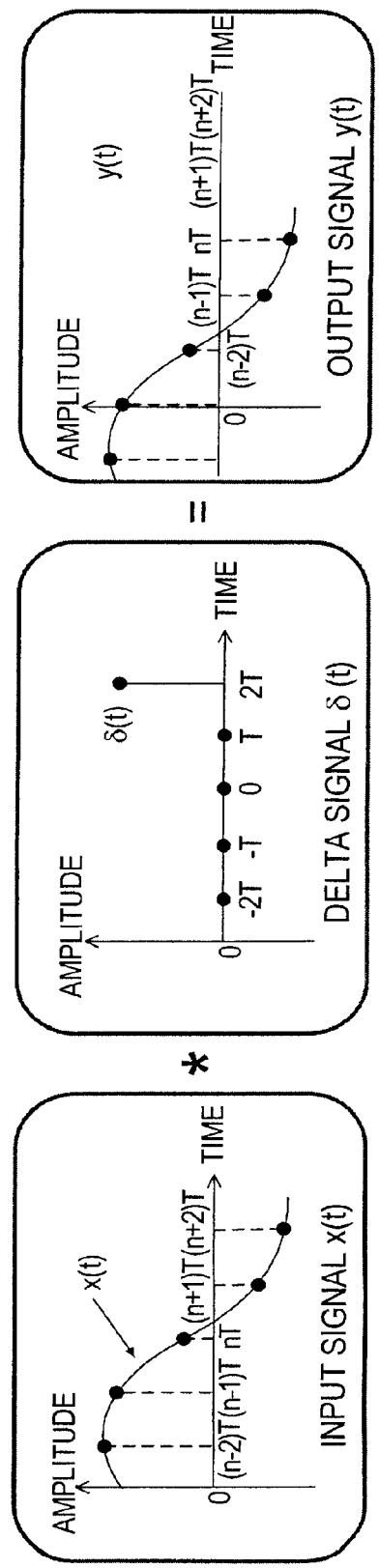

FIGS. 7A and 7B are diagrams illustrating the operation of the adaptive filter. In FIGS. 7A and 7B, the input digital signal x(t), a delta function δ(t) used as the coefficient S6, and the output digital signal y(t) are illustrated. The abscissa is a time axis. The abscissa represents tap positions in the adaptive filter illustrated in FIG. 6.

The adaptive filter 7 is an all-pass filter that allows all the input digital signal x(t) to pass. Therefore, the adaptive filter 7 executes a convolutional operation of the input digital signal x(t) and the Dirac delta function δ(t) as indicated by the following Expression (1):

[E 1]

$$y(t) = Tx(t)\sum_{n=0}^{N} \delta(t - nT) \quad \delta(t) = \begin{cases} \infty, & t = 0 \\ 0, & t \neq 0 \end{cases} \quad (1)$$

where, T represents a constant and N represents the number of taps.

As indicated by FIG. 7A and Expression (1), the input digital signal x(t) is a digital value that changes at a sampling interval of time T. The delta function δ(t) has predetermined magnitude at time t=0 (in the center tap) and has magnitude 0 in the other times. Therefore, the plurality of multipliers 12 of the adaptive filter 7 multiply the input digital signal x(t) of the center tap (t=0) with a value of the delta function δ(t) at time t=0, multiply the input digital signal x(t) of the other taps (other than t=0) with a value 0 other than time t=0, and output an added-up value of multiplication values obtained by the multiplication. The adaptive filter 7 sequentially outputs, in synchronization with a sampling dock, input digital values of the center tap of the input digital signal x(t) delay-shifted at a sampling interval. In other words, as illustrated in FIG. 7A, the output digital signal y(t) sequentially have different digital values at every sampling period centering on respective sampling timings.

The phase shift by the coefficient S6 is explained. As illustrated in FIG. 7B, the coefficient calculating circuit 6 shifts the delta function δ(t) to the right side on the time axis (i.e., shifts the tap positions to the right side) to set the coefficient S6 to, for example, a predetermined value other than zero at time 2T and zero at time other than the time 2T. When the coefficient S6 is set to such a coefficient, the output digital signal y(t) at time nT output by the adaptive filter 7 in FIG. 7B has a digital value at time (n+2)T of the input digital signal x(t). In other words, the output digital signal y(t) in FIG. 7B is a signal obtained by shifting the phase of the input digital signal x(t) to the left by two taps, i.e., delaying the phase. The input digital signal x(t) shifts to the plurality of taps in the adaptive filter 7 as time elapses. Therefore, shifting the tap positions to the left means outputting a signal two docks in the past. The phase of the input digital signal is delayed. Conversely, when the delta function δ(t) is shifted to the left side, it is possible to advance the phase.

As explained above, the phase of the delta function δ(t) is shifted to set the coefficient in the adaptive filter 7. Consequently, the adaptive filter 7 shifts the phase of the input digital signal in any direction and output the input digital signal. The correction circuit 20 and the adaptive filter 7 illustrated in FIG. 4 are explained above.

Points to be Improved of the Adaptive Filter

In the following explanation, the coefficient S6 is a sinc function rather than the Dirac delta function. The coefficient calculating circuit 6 of the correction circuit 20 illustrated in FIG. 4 is realized with a coefficient by the sinc function rather than an ideal coefficient such as the Dirac delta function because of a circuit configuration. However, when a filter coefficient by the sinc function is used, points explained below is improved.

Figure 8:
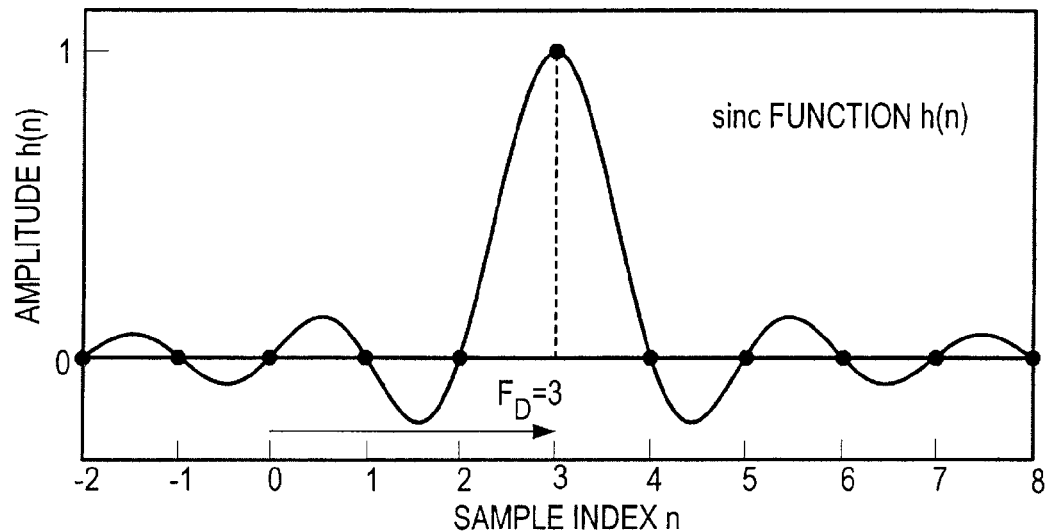
FIG. 8 is a diagram illustrating a waveform of the sinc function.

FIG. 8 is a diagram illustrating a waveform of the sinc function. A sinc function h(n) is represented by the following Expression (2):

[E 2]

$$h(n) = \frac{\sin[\pi(n - F_D)]}{\pi(n - F_D)} = \text{sinc}[\pi(n - F_D)] = \begin{cases} 1 & n = F_D \\ 0 & n \neq F_D \end{cases} \quad (2)$$

where, FD represents a phase shift amount (or delay amount) in the abscissa direction corresponding to the plurality of taps of the adaptive filter 7. As it is evident from FIG. 8, when a value n of the abscissa is equal to the phase shift amount FD (FD=3 in FIG. 8) (n=FD=3), an output of the sinc function h(n) is 1. When the value n of the abscissa is other than the phase shift amount FD (FD=3), the output of the sinc function h(n) is 0. When the adaptive filter 7 uses the filter coefficient by the above sinc function h(n), the adaptive filter 7 is an all-pass filter like the filter that uses the filter coefficient by the delta function δ(t).

Figure 9:
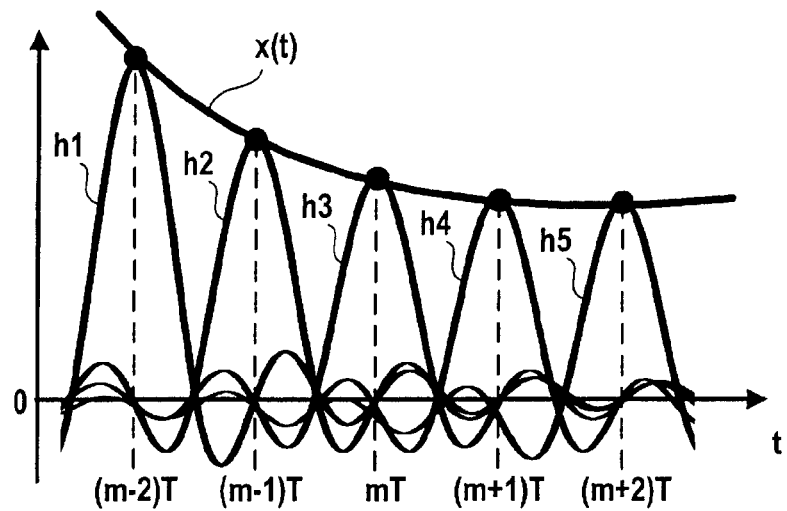
FIG. 9 is a diagram illustrating the operation of the adaptive filter that uses filter coefficients by sinc functions.

FIG. 9 is a diagram illustrating the operation of the adaptive filter that uses filter coefficients by sinc functions. When a filter function by a sinc function h3 is used, the input digital signal x(t) in a tap mT is output. When a filter coefficient by a sinc function h5 is used, the input digital signal x(t) in a tap (m+2) T is output and a phase is shifted (delayed).

Even when the coefficients by the sinc functions are set as explained above, when the phase shift amount (delay amount) FD is an integer, it is possible to perform phase shift control same as the phase shift control performed by using the coefficient by the delta function. However, a skew amount between the ADC channels in the time interleave ADC is time shorter than a period of a sampling clock. Therefore, the phase shift amount (delay amount) FD needs to be set at accuracy of a non-integer (a number after the decimal point).

Figure 10:
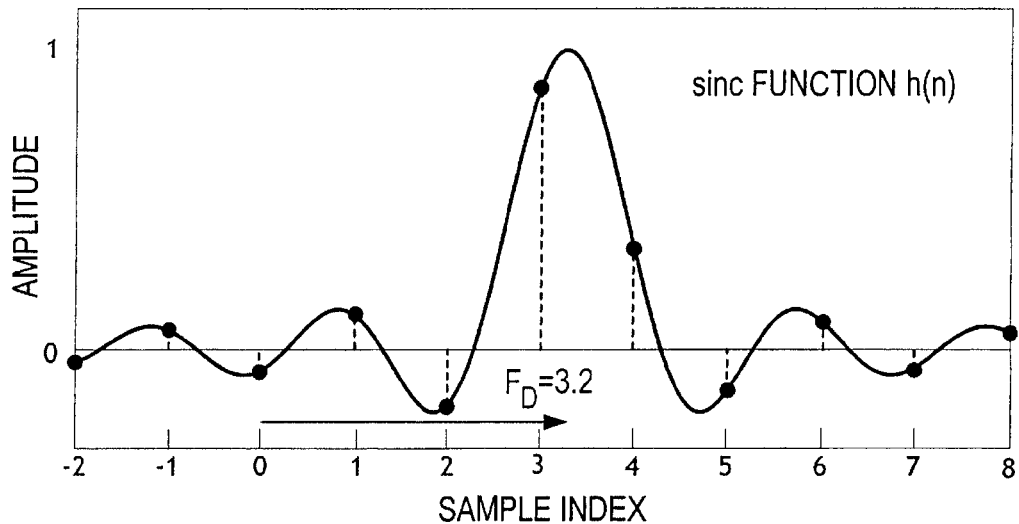
FIG. 10 is a diagram illustrating a waveform in an example in which the phase shift amount (delay amount) FD of the sinc function h(n) is a non-integer.

FIG. 10 is a diagram illustrating a waveform in an example in which the phase shift amount (delay amount) FD of the sinc function h(n) is a non-integer. In this example, the phase shift amount FD is 3.2, which is a non-integer. Therefore, although a coefficient input to the multipliers of the taps in the adaptive filter 7 takes a large value close to 1 at n=3, the coefficient is not zero at n=−2 to 2 and 4 to 8. However, the phase shift amount FD is controlled to n=3.2 according to a large value at n=3 and a relatively large value at n=4. The corresponding multipliers in the adaptive filter 7 output relatively small multiplication values according to relatively small values at the values other than n=3 and 4. Therefore, when the phase-shift amount FD is a non-integer, the output digital signal y(t) of the adaptive filter 7 is a value different from the input digital signal x(t).

The following Expression (3) represents a transfer function Hd of the adaptive filter 7 in the case of the waveform in which, as illustrated in FIG. 8, a coefficient of only one tap is 1 and coefficients of the other tamps are 0, i.e., an ideal transfer function Hd.

[E 3]

$$H_d(e^{j\omega}) = e^{-j\omega F_D}, \; |\omega| \leq |\pi| \quad (3)$$

In other words, according to the transfer function Hd, the output digital signal y(t) obtained by shifting the phase of the input digital signal x(t) by FD is generated.

A transfer function H of the adaptive filter that uses the coefficient of the sinc function is as represented by the following Expression (4). In other words, since the sinc function h(n) is adopted, an error is added to the ideal transfer function Hd.

[E 4]

$$H(e^{j\omega}) = \sum_n^N h(n)e^{j\omega}, \; h(n) = \text{sinc}[\pi(n - F_D)] \quad (4)$$

As a result, a difference between Expressions (4) and (3) is an error E, which is as represented by the following Expression (5):

[E 5]

$$E(e^{j\omega}) = \sum_n^N h(n)e^{j\omega} - e^{-j\omega F_D} = \sum_n^N h(n)e^{j\omega} - (\cos\omega F_D - j\sin\omega F_D) \quad (5)$$

The error E is a Nyquist angular frequency ωs, i.e., when ω=π, the error E is as represented by the following Expression (6).

[E 6]

$$|E(e^{j\omega})|_{\omega=\pi}| = \frac{1}{\sqrt{\{H(-1) - \cos(\pi F_D)\}^2 + \{\sin(\pi F_D)\}^2}} \geq |\sin(\pi F_D)| \quad (6)$$

Figure 11:
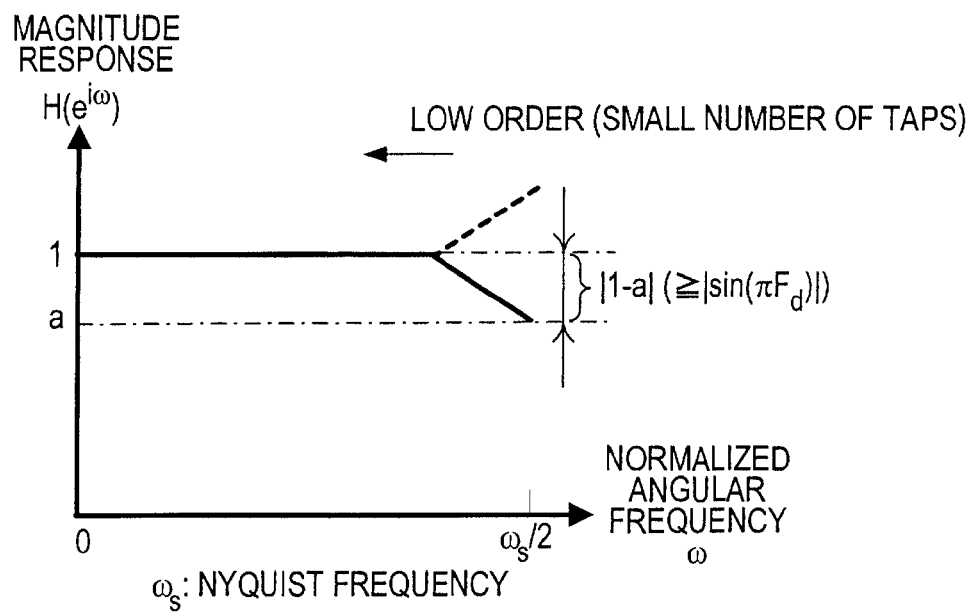
FIG. 11 is a diagram illustrating a frequency characteristic of the transfer function.

FIG. 11 is a diagram illustrating a frequency characteristic of the transfer function. The error indicated by Expressions (5) and (6) is a negligible degree when the input digital signal x(t) has a low frequency. The transfer function H is the ideal value 1. However, when the input digital signal x(t) has a high frequency, the error increases. The transfer function H decreases in a high frequency band when the phase shift amount FD is positive and increases when the phase shift amount FD is negative (a broken line). "a" in FIG. 11 is an arbitrary value.

When the coefficient by the sinc function is set, the transfer function H of the adaptive filter 7 has the frequency characteristic illustrated in FIG. 11. A reason for this is as explained below. The filter coefficient by the sinc function illustrated in FIG. 10 has small amplitude and is positive and negative at values other than the peak value in the center. Therefore, when the analog input signal fin has a low frequency, the amplitude in the plurality of taps in the adaptive filter 7 gently changes. In the convolutional operation with the coefficient illustrated in FIG. 10, cumulative values of multiplication values of the taps other than the tap in the center are offset by a positive coefficient and a negative coefficient. A value close to the ideal value is output. This is the reason why the transfer function H is 1 in a low frequency domain in FIG. 11. The transfer function H=1 means that the adaptive filter 7 allows an input signal to pass and outputs the input signal as it is.

On the other hand, when the analog input signal fin has a high frequency, the amplitude of input signals in the plurality of taps in the adaptive filter substantially fluctuates. The offset effect by the positive and negative values of the filter coefficient is weakened and the error increases. As a result, in a high frequency domain, the transfer function H falls or rises from the ideal value 1. The falling or rising of the transfer function H from the ideal value 1 means that an output signal of the adaptive filter 7 is not equal to an input signal and has an error.

When the number of taps of the adaptive filter 7 is large, the offset effect is intensified and the frequency characteristic H is 1 up to a high frequency. Conversely, when the number of taps is small, the offset effect is weakened and the transfer function H falls or rises from 1 even at a low frequency.

A group delay amount (a phase shift amount) of the adaptive filter is explained. The following Expression (7) represents a frequency response of the adaptive filter 7. A frequency characteristic of the adaptive filter 7 has an amplitude characteristic G(ω) and a phase characteristic θ(ω). Expression (7) corresponds to the transfer function H of Expression (4).

[E 7]

$$H(e^{j\omega}) = G(\omega)e^{j\theta(\omega)} \quad (7)$$

where, G(ω) represents an amplitude characteristic and θ(ω) represents a phase characteristic.

On the other hand, a group delay characteristic (a phase shift amount) D(ω) of the adaptive filter 7 is obtained by differentiating the phase characteristic θ(ω) with respect to the angular frequency ω from Expression (7). The group delay characteristic D(ω) is as represented by the following Expression (8):

[E 8]

$$D(\omega) = -\frac{d}{d\omega}\theta(\omega) - F_D \quad (8)$$

where, $F_D$ represents a delay amount of the filter.

Therefore, when a logarithm of Expression (7) is calculated, the following Expression (9) is derived.

[E 9]

$$\ln H(e^{j\omega}) = \ln G(\omega) + j\theta(\omega) \quad (9)$$

where, ln represents a logarithm.

When Expression (9) is differentiated with respect to the angular frequency ω, the following Expression (10) is obtained.

[E 10]

$$\frac{d}{d\omega}\ln H(e^{j\omega}) = \frac{G'(\omega)}{G(\omega)} + j\frac{d}{d\omega}\theta(\omega) \quad (10)$$

Therefore, when Expression (10) is substituted in Expression (8), the group delay D(ω) of the adaptive filter 7 is as represented by the following Expression (11):

[E 11]

$$D(\omega) = -\frac{d}{d\omega}\theta(\omega) - F_D \quad (11)$$
$$= -\text{Im}\left\{\frac{d}{d\omega}\ln H(e^{j\omega})\right\} - F_D = -\text{Im}\left\{\frac{H'(e^{j\omega})}{H(e^{j\omega})}\right\} - F_D$$

From Expression (11), it is understood that the group delay $D(\omega)$ has a characteristic corresponding to a differential value H' of the transfer function H of Expression (7), i.e., Expression (4). The differential value H' is obtained by differentiating the characteristic illustrated in FIG. 11 with respect to the angular frequency $\omega$.

Figure 12:
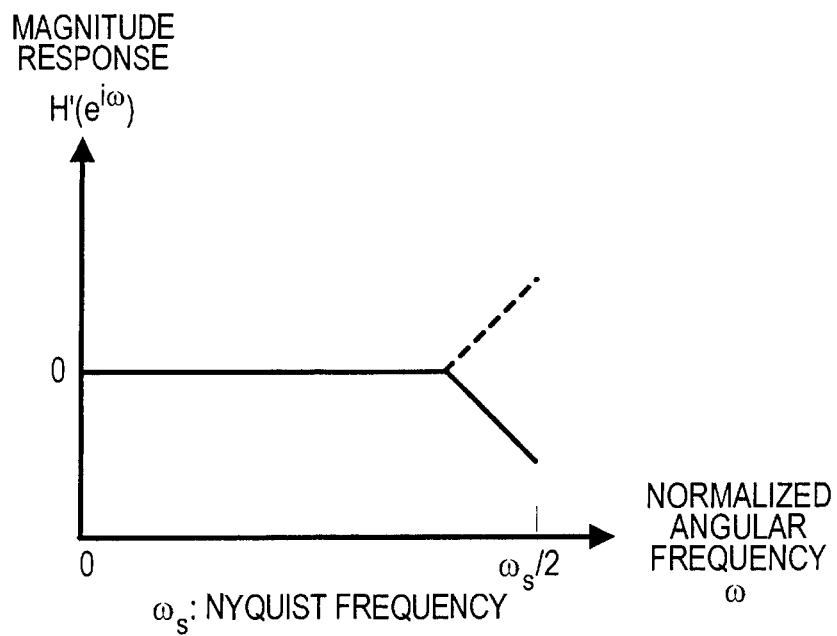
FIG. 12 is a diagram illustrating a characteristic of the differential value H'.

FIG. 12 is a diagram illustrating a characteristic of the differential value H'. The gradient of the graph of the transfer function H illustrated in FIG. 11 is H'. Therefore, the differential value H' in FIG. 12 is 0 in a low frequency domain. In a high frequency domain, the differential value H' is minus when the transfer function H falls and is plus when the transfer function H rises.

Figure 13:
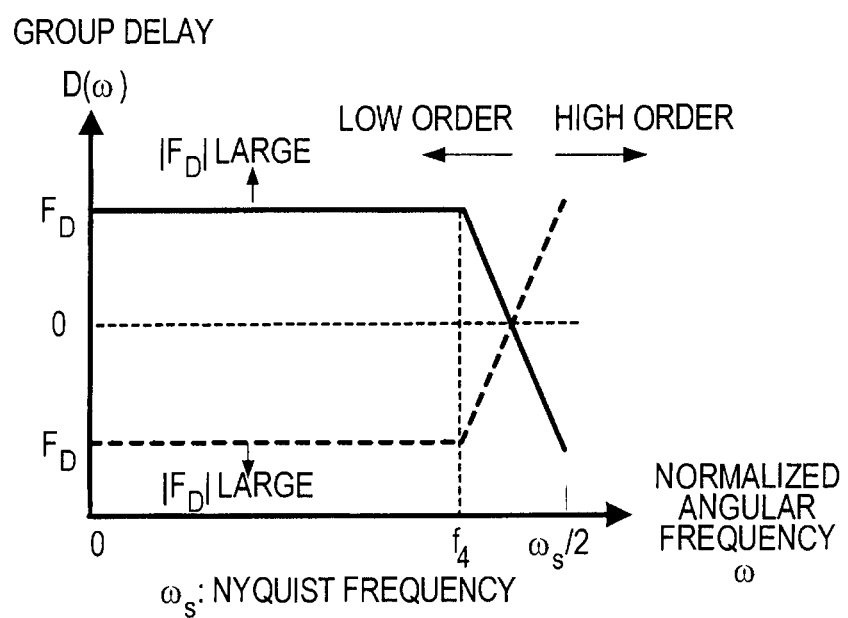
FIG. 13 is a diagram illustrating a frequency characteristic of the group delay $D(\omega)$.

FIG. 13 is a diagram illustrating a frequency characteristic of the group delay $D(\omega)$. In Expression (11), the phase shift amount FD is added to H'. Therefore, when FD is positive, a characteristic chart illustrated in FIG. 13 is a characteristic indicated by a solid line shifted in the positive direction of the ordinate. When FD is negative, the characteristic chart is a characteristic indicated by a broken line shifted in the negative direction of the ordinate. When an absolute value of the positive phase shift amount FD is increased, the characteristic shifts in the positive direction. When an absolute value of the negative phase shift amount FD is increased, the characteristic shifts in the negative direction. A frequency f4 at which the group delay falls or rises is higher as the adoptive filter 7 is a higher-order filter (having a larger number of taps) and is lower as the adaptive filter 7 is a lower-order filter (having a smaller number of taps).

Figure 14:
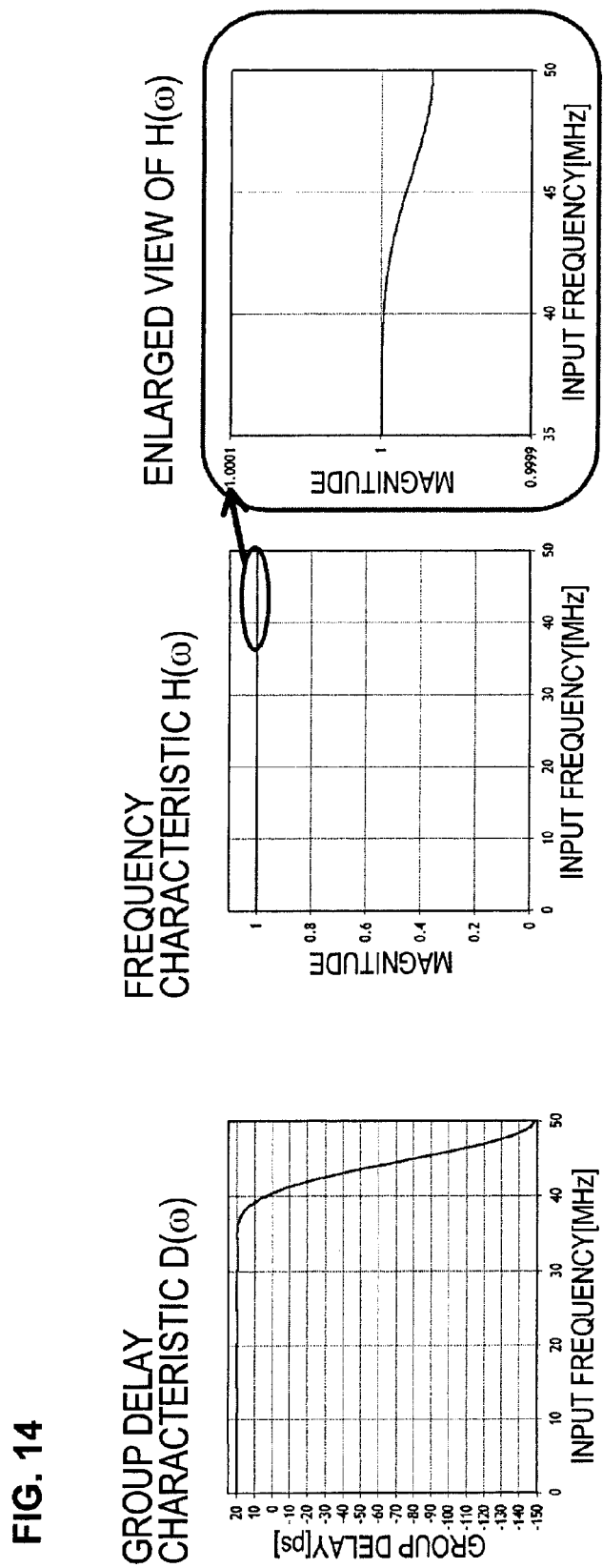
FIG. 14 is a diagram illustrating specific waveform examples of the group delay characteristic $D(\omega)$ and the frequency characteristic $H(\omega)$.

FIG. 14 is a diagram illustrating specific waveform examples of the group delay characteristic $D(\omega)$ and the frequency characteristic $H(\omega)$. As illustrated in FIG. 14, the frequency characteristic $H(\omega)$ of the transfer function of the adaptive filter 7 slightly falls in a high-frequency domain. The fall is seen in an enlarged view of $H(\omega)$. According to the fall of the frequency characteristic $H(\omega)$, the group delay characteristic $D(\omega)$ corresponding to a differential value of $H(\omega)$ falls to the minus side in the high-frequency domain. In this way, the specific waveform example in FIG. 14 coincides with the frequency characteristic of the group delay illustrated in FIG. 13.

As explained above, the coefficient by the sinc function is set in the adaptive filter 7 and a phase is about to be shifted. In such case, when an input signal has a low frequency, it is possible to shift the phase in a direction corresponding to the delay amount FD. However, when the input signal has a high frequency, it is not always possible to shift the phase in the direction. When the input signal has a high frequency, the direction of the phase shift is opposite to the direction corresponding to the delay amount FD. Moreover, in the characteristic illustrated in FIG. 13, it is confirmed that the gradient of the fall indicated by the solid line (or the rise indicated by the broken line) in a frequency domain higher than the frequency f4 is steeper when the delay amount FD is increased.

As explained in FIG. 13, in the case where the adaptive filter uses the coefficient by the sinc function, the group delay amount $D(\omega)$ has a peculiar frequency characteristic. Because of such a frequency characteristic, it is preferable to contrive the feedback control of the skew error suppression by the correction circuit 20 illustrated in FIG. 4. This point is explained below.

Figure 15A:
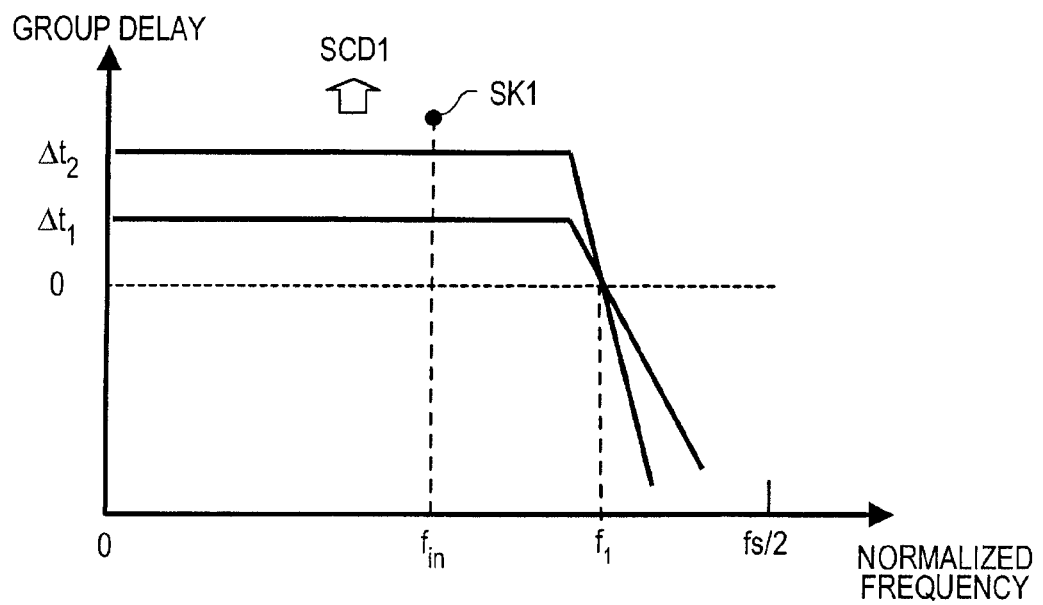
FIGS. 15A and 15B are diagrams illustrating a frequency characteristic of the group delay D(ω) and skew correction control of the adaptive filter in which the coefficient by the sinc function is set.
Figure 15B:
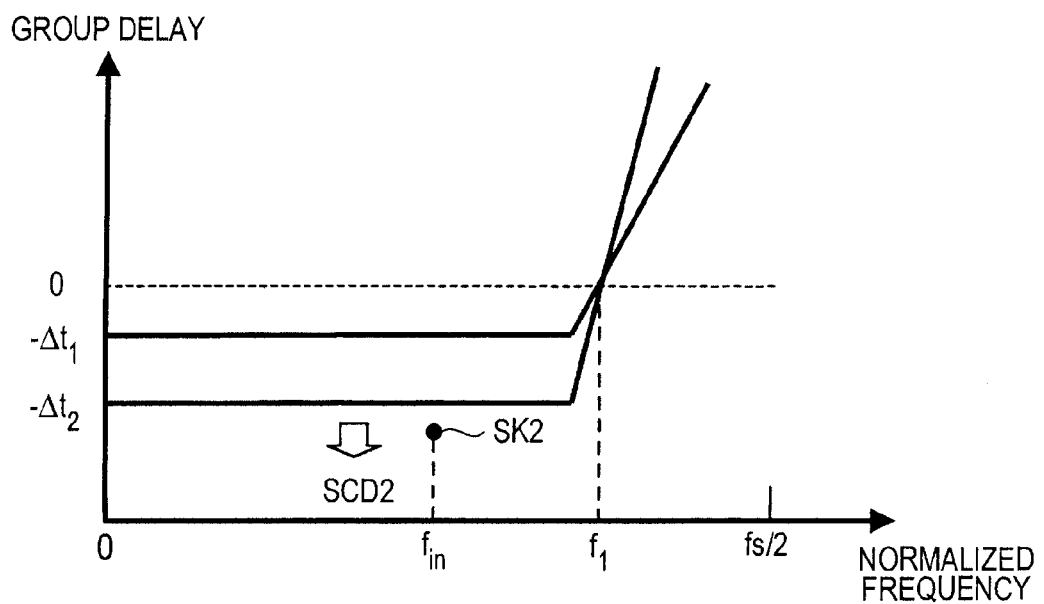

FIGS. 15A and 15B are diagrams illustrating a frequency characteristic of the group delay $D(\omega)$ and skew correction control of the adaptive filter in which the coefficient by the sinc function is set. It is assumed that a frequency of an input signal to the adaptive filter is fin. The frequency fin is sufficiently low compared with the sampling frequency fs/2.

In FIG. 15A, a phase shift amount (a delay amount) necessary in the adaptive filter in order to suppress a skew included in the digital signal D2 on the ADC channel 200 side is SK1. To set the phase shift amount to SK1 in the adaptive filter, a phase shift amount of the sinc function also needs to be set to SK1. Therefore, in this case, the coefficient calculating circuit 6 illustrated in FIG. 4 calculates a coefficient while controlling the phase shift amount FD of the sinc function to Δt1 and Δt2 in a skew correction direction SCD1 indicated by an arrow and sets the coefficient in the adaptive filter. Consequently, it is possible to suppress the average dt(n) of the skew error and then match the phase shift amount FD to the target phase shift amount SK1.

On the other hand, in FIG. 15B, a sign of a phase shift amount (a delay amount) SK2 necessary for suppressing a skew included in the digital signal D2 on the ADC channel 200 side is opposite to the sign of the phase shift amount SK1. In this case, as in the case illustrated in FIG. 15A, the coefficient calculating circuit 6 illustrated in FIG. 4 calculates a coefficient while controlling the phase shift amount FD of the sinc function to −Δt1 and −Δt2 in a skew correction direction SCD2 indicated by an arrow and sets the coefficient in the adaptive filter. Consequently, it is possible to suppress the average dt(n) of the skew error and then match the phase shift amount FD to the target phase shift amount SK2.

Figure 16A:
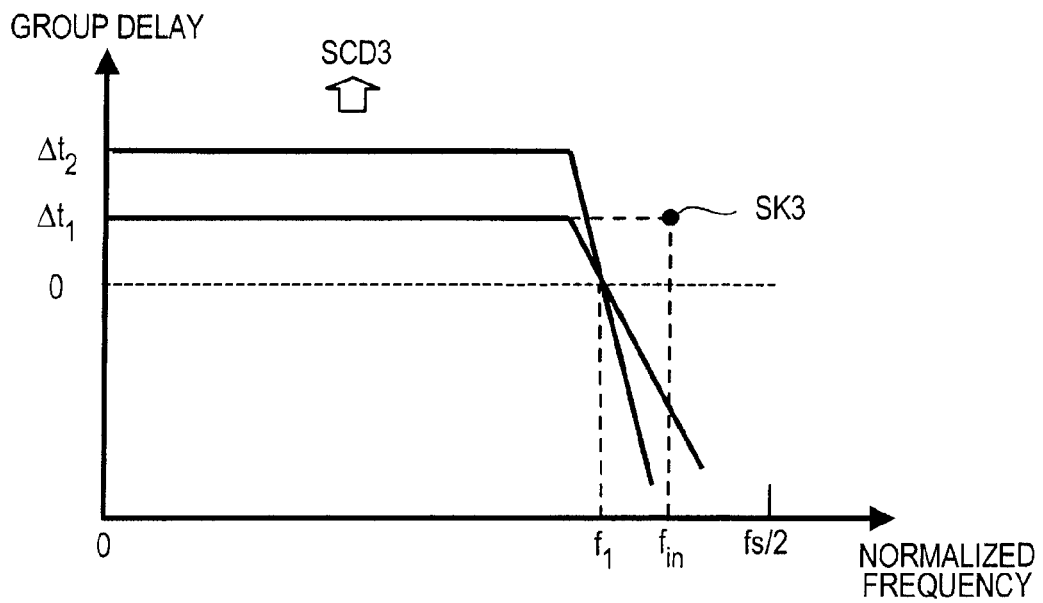
FIGS. 16A and 16B are diagrams illustrating a problem of the skew correction control performed when an input signal has a high frequency.
Figure 16B:
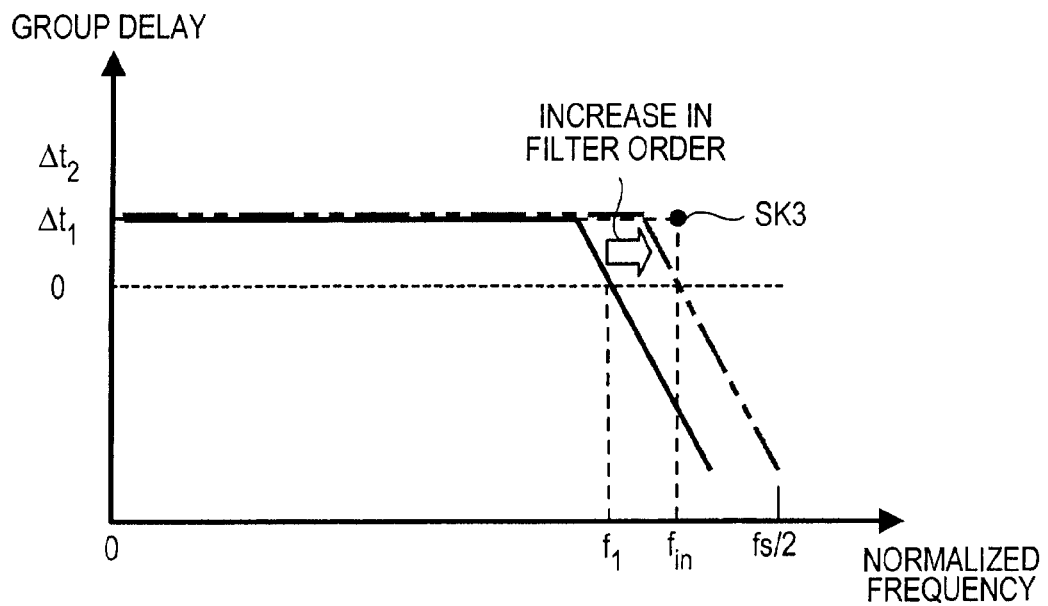

FIGS. 16A and 16B are diagrams illustrating a problem of the skew correction control performed when an input signal has a high frequency. In an example illustrated in FIGS. 16A and 16B, the frequency fin of the input signal is a high frequency closer to the sampling frequency fs/2 and is higher than a frequency f1 at a zero-cross point where the group delay of the adaptive filter becomes polarity opposite to the set delay amount FD.

In FIG. 16A, a phase shift amount (a delay amount) necessary for skew correction is SK3. In this case, even if the coefficient calculating circuit 6 calculates a coefficient while controlling the phase shift amount FD of the sinc function to Δt1 and Δt2 in a skew correction direction SCD3 and sets the coefficient in the adaptive filter as in FIG. 15A, since the frequency fin of the input signal is higher than the frequency f1 at the zero-cross point, a delay amount of the adaptive filter changes in a direction of the opposite polarity. Therefore, it is impossible to set the delay amount of the adaptive filter to the delay amount SK3 necessary for the skew correction irrespective of how much the phase shift amount FD is increased in the skew correction direction SCD3.

When the number of taps of the adaptive filter is increased to raise an order as illustrated in FIG. 16B, it is possible to shift the frequency characteristic in an arrow direction (a high-frequency direction). The coefficient control for the adaptive filter only has to be performed as illustrated in FIGS. 15A and 15B. However, when the number of taps of the adaptive filter is increased, a circuit size increases and power consumption and a chip area increase. Therefore, this is not a desirable method.

Skew Correction Method in this Embodiment

Figure 17:
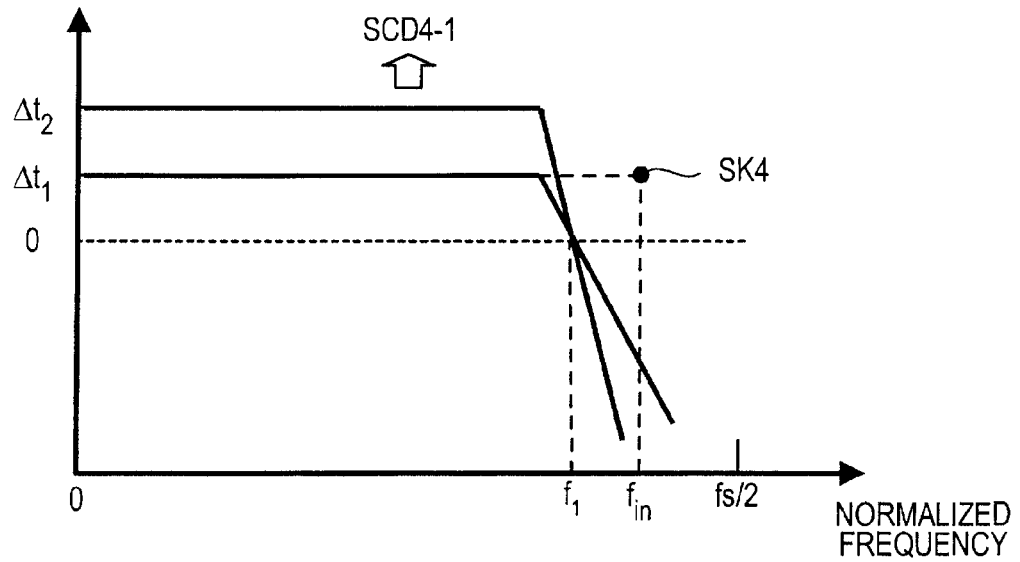
FIG. 17 is a diagram for explaining a first skew correction method in this embodiment.
Figure 17:
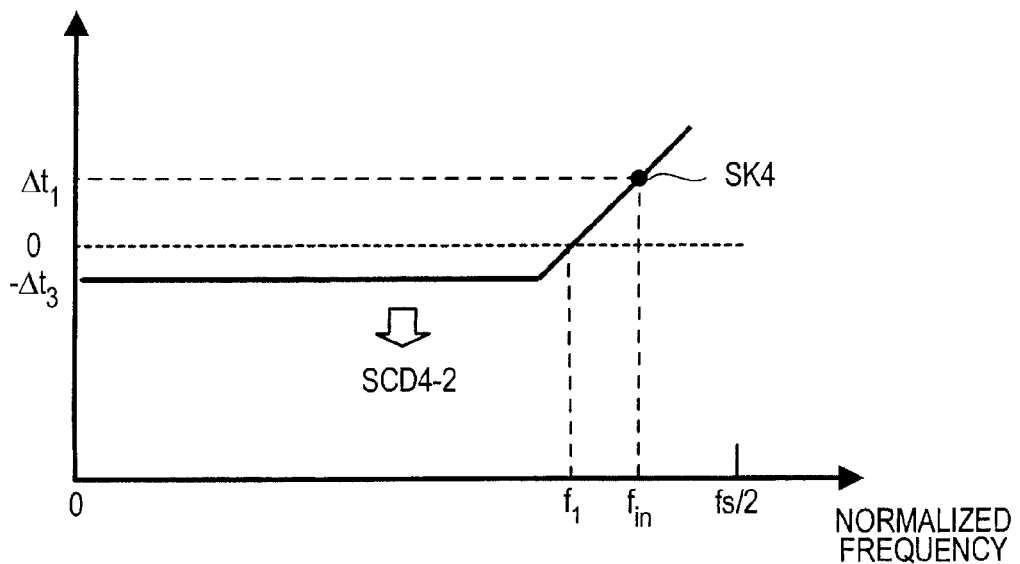

FIG. 17 is a diagram for explaining a first skew correction method in this embodiment. In an example illustrated in FIG.

17, as in FIGS. 16A and 16B, a phase shift amount (a delay amount) necessary for skew correction is SK4. The frequency fin of the input signal is higher than the frequency f1 at the zero-cross point, i.e., f1<fin<fs/2.

In the first skew correction method, as illustrated in Step 1 in FIG. 17, the coefficient calculating circuit 6 calculates a coefficient for controlling the phase shift amount FD of the sinc function to Δt1 and Δt2 in a skew correction direction SCD4-1 and sets the coefficient in the adaptive filter such that the phase shift amount (the delay amount) SK4 is obtained. However, in the example illustrated in FIGS. 16A and 16B and FIG. 17, since the frequency fin of the input signal is higher than the frequency f1 at the zero-cross point, a shape shift direction is opposite. Therefore, the skew error dt(t) increases to the contrary. This is because, as illustrated in FIG. 17, as the frequency characteristic of the group delay, in a frequency domain higher than the frequency f1 at the zero-cross point, the phase shift of the adaptive filter increases in the negative direction as the phase shift amount FD is increased in the positive direction.

Therefore, when the average dt(t) of the skew error is not suppressed in Step 1, even if the phase shift amount FD corresponding to the coefficient (FD in fin<f2, f1) reaches an allowable maximum value, as illustrated in Step 2, the coefficient calculating circuit 6 inverts the polarity of the phase shift amount FD of the sinc function and calculates and controls a coefficient to increase an absolute value of FD from FD=−Δt3 in a skew correction direction SCD4-2. When the phase shift amount FD is negative, the phase shift of the adaptive filter is in the positive direction at the frequency fin (>f1). When the absolute value of the phase shift amount FD is increased, the phase shift amount (the delay amount) increases in the positive direction. In other words, the gradient of the frequency characteristic becomes steeper at a frequency higher than f1. Therefore, as illustrated in Step 2 in FIG. 17, it is possible to give the necessary phase shift SK4 to the adaptive filter. The skew error dt(t) is suppressed.

In FIG. 17, the phase shift amount (the delay amount) necessary for skew correction is SK4 in the positive direction. However, the same control is possible when the phase shift amount is a negative phase shift amount. In other words, first, the coefficient calculating circuit 6 only has to perform control the coefficient to gradually increase the FD absolute value of the phase shift amount FD from a negative value and, when the absolute value reaches a maximum value, invert the polarity and gradually increase the absolute value of FD from a positive value.

Figure 18:
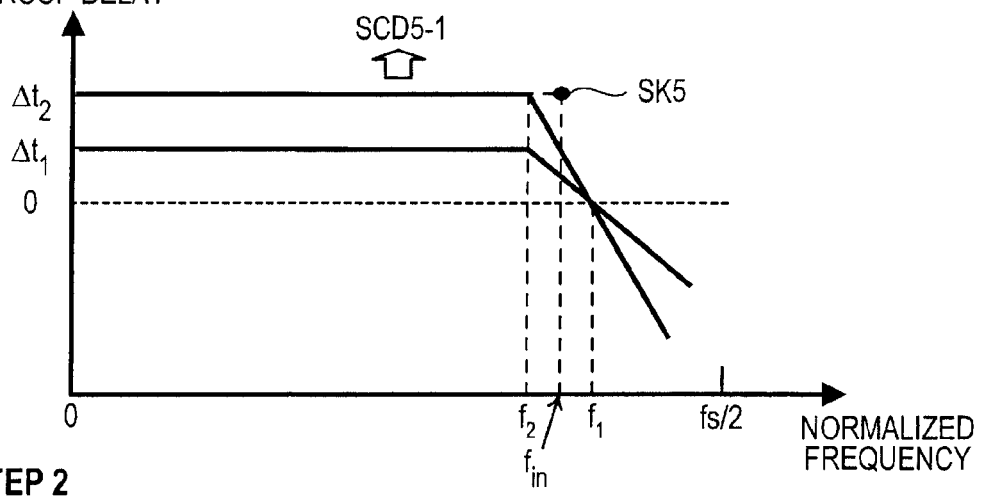
FIG. 18 is a diagram for explaining a second skew correction method in this embodiment.
Figure 18:
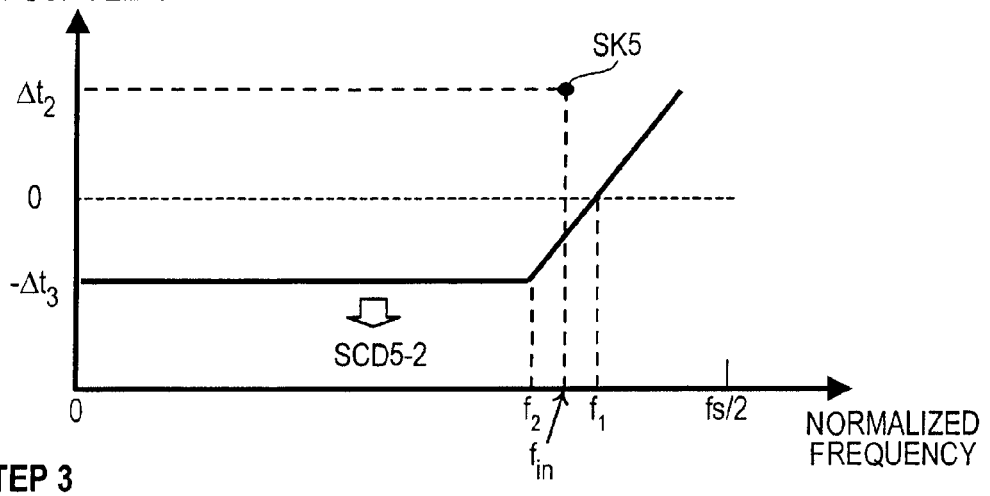
Figure 18:
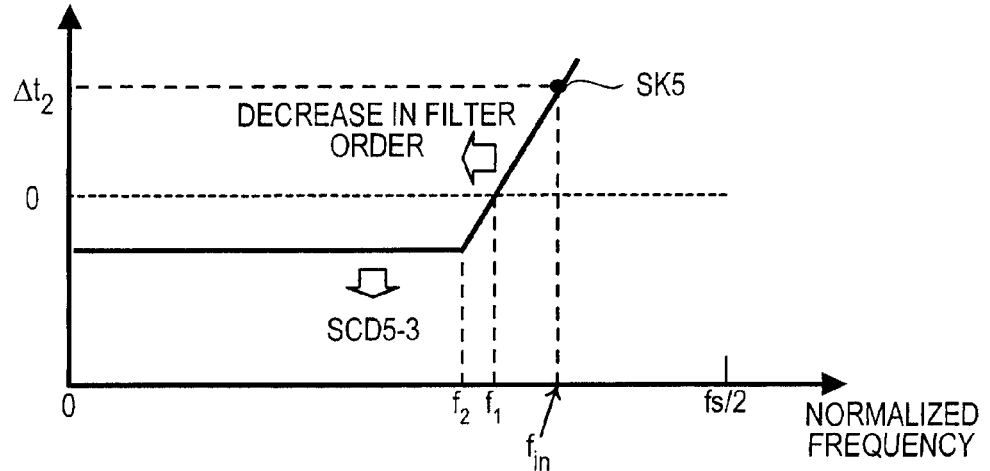

FIG. 18 is a diagram for explaining a second skew correction method in this embodiment. In an example illustrated in FIG. 18, unlike FIG. 17, the frequency fin of the input signal is lower than the frequency f1 at the zero-cross point and higher than a frequency f2 at which the group delay starts to decrease (when the group delay has negative polarity, a frequency at which the group delay starts to increase), i.e., f2<fin<f1. When the frequency fin of the input signal is lower than the frequency f1 at the zero-cross point in this way, it is often impossible to suppress a skew with the first skew correction method illustrated in FIG. 17.

In the second skew correction method illustrated in FIG. 18, correction control in Step 1 and Step 2 is the same as the correction control in FIG. 17. In Step 1, the coefficient calculating circuit 6 performs control the coefficient to gradually increase the FD absolute value of the phase shift amount FD from a positive value and, when the absolute value reaches a maximum value, in Step 2, inverts the polarity and gradually increases the absolute value of FD from a negative value. However, since the frequency fin is in the relation f2<fin<f1, it is impossible to adjust the group delay with respect to the frequency fin of the adaptive filter to SK5.

Therefore, when the absolute value of the phase shift amount FD corresponding to the coefficient reaches the maximum value in Step 2, in Step 3, the coefficient calculating circuit 6 reduces the number of taps of the adaptive filter and reduces a filter order. To reduce the number of taps, a coefficient set in the multipliers 712 at both end sides of the adaptive filter only has to be set to zero to prevent outputs of the both sides multipliers 712 from being added to the adder 713. When the order of the filter decreases, in the frequency characteristic of the group delay, a frequency f2 at which a group delay amount falls (or rises) is low. Therefore, the order of the filter is reduced until the frequency fin of the input signal becomes higher than the frequency f1 at the zero-cross point. Then, as in Step 2, the absolute value of the phase shift amount FD is gradually increased from a negative value. As a result, the group delay amount increases in the positive direction at the frequency fin of the input signal. It is possible to give a necessary group delay amount of the delay amount SK5 to the frequency fin.

Time Interleave ADC in the First Embodiment

Figure 19:
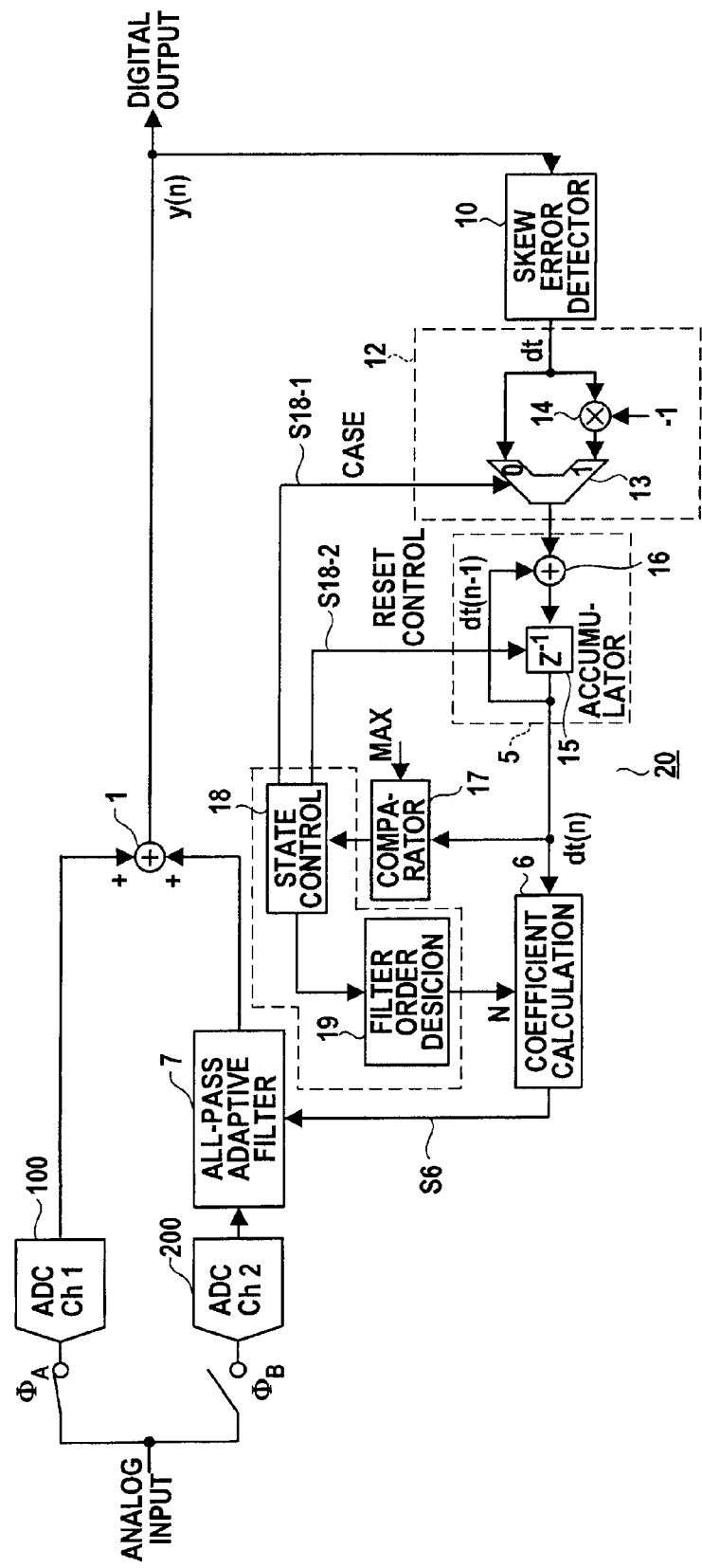
FIG. 19 is a configuration diagram of the time interleave ADC in the first embodiment.

FIG. 19 is a configuration diagram of the time interleave ADC in the first embodiment. As components different from the components illustrated in FIG. 4, a polarity inverting circuit 12 that inverts the polarity of the skew error dt is provided between the skew-error detecting circuit 10 and the accumulator 5 and a comparator 17 that determines whether the average dt(n) of the skew error reaches a maximum allowable value MAX, a state control circuit 18 that controls Steps 1, 2, and 3 explained in FIGS. 16A and 16B and FIG. 17, and a filter-order deciding circuit 19 that determines the order of the adaptive filter 7 are provided.

The polarity inverting circuit 12 includes a multiplier 14 configured to multiply the skew error dt with (−1) to invert polarity and a multiplexer 13 configured to select, on the basis of a control signal S18-1, whether an output of the skew-error detecting circuit 10 is output without inverting the polarity or after inverting the polarity. The accumulator 5 includes a delay FF circuit 15 configured to delay an output of the polarity inverting circuit 12 by one clock and an adder 16 configured to add an output of the delay circuit 15 to the present skew error dt, which is the output of the polarity inverting circuit 12. Therefore, an output of the accumulator 5 is the average dt(n) of a skew error obtained by accumulating the skew error dt reduced at a predetermined ratio according to the step size in the skew-error detecting circuit 10. The state control circuit 18 controls, with a case control signal S18-1, presence or absence of the polarity inversion by the polarity inverting circuit 12 and resets, with a reset control signal S18-2, an accumulation value of the accumulator 5.

Figure 20:
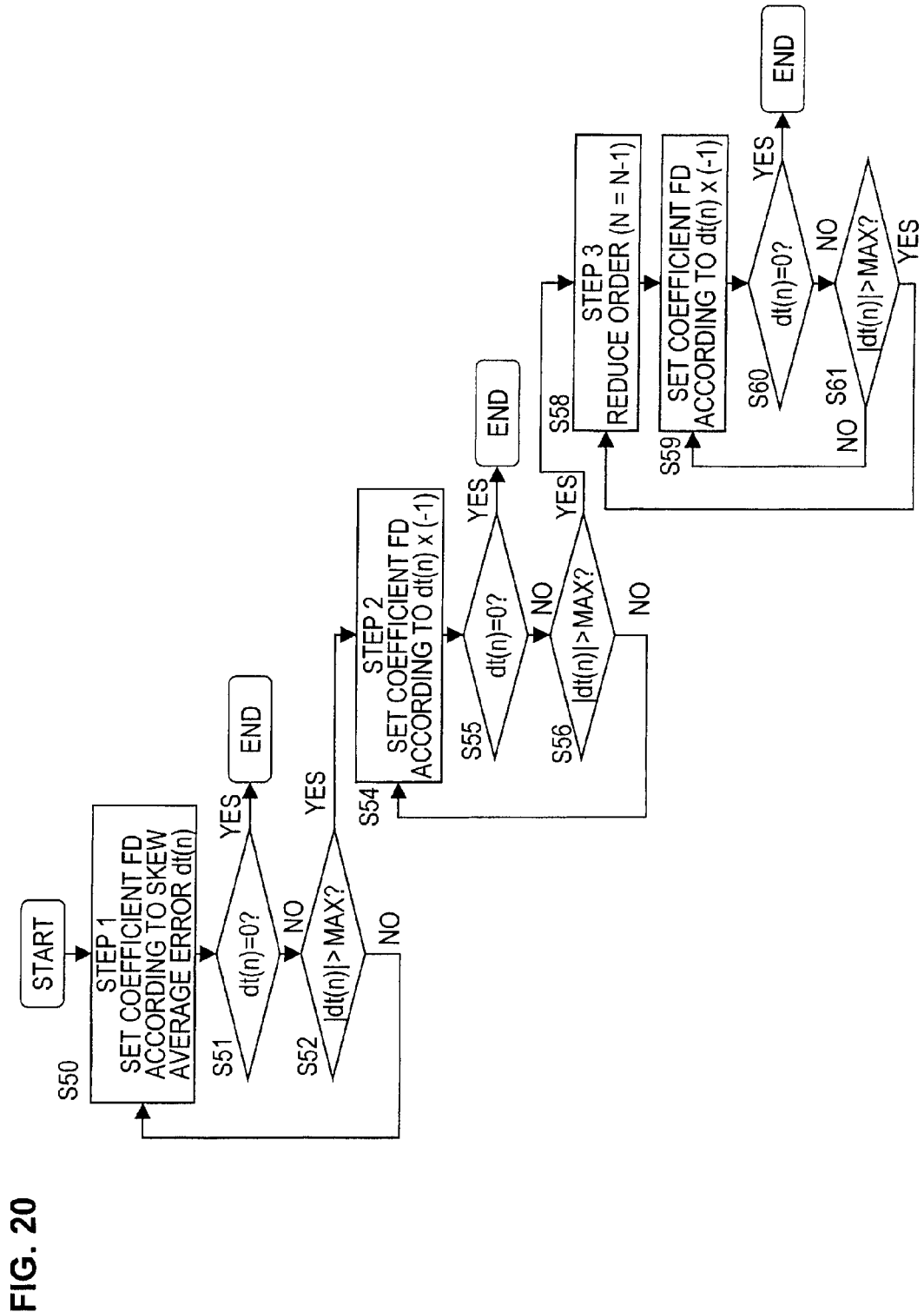
FIG. 20 is a flowchart for explaining the operation of the skew correction circuit 20 of the time interleave ADC illustrated in FIG. 19.

FIG. 20 is a flowchart for explaining the operation of the skew correction circuit 20 of the time interleave ADC illustrated in FIG. 19. The skew correction circuit 20 performs the three steps in FIG. 18 in order as skew correction. The operation of the skew correction circuit 20 illustrated in FIG. 19 is explained below according to the flowchart of FIG. 20.

Step 1

First, in Step 1, the state control circuit 18 sets the case control signal S18-1 to 0 to control the polarity inverting circuit 12 to non-inverting and sets the reset control signal S18-2 to a reset state to reset the delay FF circuit 15 in the accumulator 5 for resetting the accumulation value. According to the magnitude and the polarity of the average value dt(n) of the skew error, the coefficient calculating circuit 6 calculates the necessary phase shift amount (delay amount) FD, calculates the coefficient S6 using the sinc function, and sets the coefficient S6 in the multipliers 12 (see FIG. 6) of the taps of the adaptive filter 7 (S50). As a result, when the average dt(n) of the obtained skew error decreases to zero (or suppressed to a desired small level), the skew correction control ends (YES in S51). However, when the average dt(n) of the skew error does not decrease to zero (NO in S51), the state control circuit 18 repeats Step S50 while an absolute value of the average dt(n) does not reach the allowable maximum value MAX (NO in S52) or the phase shift amount FD corresponding to the coefficient S6 does not reach the maximum amount. Consequently, the average dt(n) of the skew error is asymptotic to zero. The comparator 17 determines whether the absolute value of the average dt(n) of the skew error reaches the maximum value MAX. The comparator 17 informs the state control circuit 18 of a result of the determination. Or, the coefficient calculation circuit 6 determines whether FD corresponding to S6 reaches to the maximum, and informs to the state control circuit 18 of the determination.

The skew correction control in Step 1 is as explained with reference to FIGS. 17 and 18. The coefficient calculating circuit 6 determines the polarity of the necessary phase shift amount (delay amount) FD according to the polarity of the average dt(n) of the skew error. The coefficient calculating circuit 6 determines the magnitude of the necessary phase shift amount (delay amount) FD according to the magnitude of the average dt(n) of the skew error. The phase shift amount (the delay amount) FD corresponds to the group delay amount on the ordinate in FIGS. 17 and 18.

Step 2

When the comparator 17 detects that the average dt(n) of the skew error reaches the maximum value MAX in Step 1 (YES in S52), or when the FD corresponding to S6 reaches to the maximum, the state control circuit 18 sets the case control signal S18-1 to 1, sets the reset control signal S18-2 to the reset state, and shifts to the control in Step 2. Consequently, the polarity of the skew error dt output by the skew-error detecting circuit 10 is inverted and the accumulation value is reset.

According to the magnitude and the polarity of the average dt(n) of the skew error, the coefficient calculating circuit 6 calculates the necessary phase shift amount (delay amount) FD, calculates the coefficient S6 using the sinc function, and sets the coefficient S6 in the multipliers 12 of the taps of the adaptive filter 7 (S54). Step S54 is repeated while the average dt(n) of the skew error does not decrease to zero (NO in S55) and the absolute value of the average dt(n) does not reach the maximum MAX or FD does not reach the maximum (No in S56).

In Step 2, according to the polarity inversion of the polarity inverting circuit 12, the coefficient calculating circuit 6 sets the coefficient S6 according to an imaginary phase shift amount −SK4 obtained by inverting the polarity of the phase shift amount SK4 necessary for the adaptive filter 7. Therefore, the correction circuit 20 performs correction control to gradually increase the absolute value of the phase shift amount FD on the negative side and suppress the average dt(n) of the skew error.

In the case of the example illustrated in FIG. 17, in Step 2, the coefficient S6 corresponding to the phase shift amount SK4 necessary for the adaptive filter is set, the average of the skew error is appropriately controlled, and the skew correction control ends. However, in the case of the example illustrated in FIG. 18, in Step 2, the average dt(n) of the skew error is not appropriately controlled and reaches the maximum value MAX or FD reaches to the maximum (YES in S56).

Step 3

When the comparator 17 detects in Step 2 that the average dt(n) of the skew error reaches the maximum value MAX or FD reaches to the maximum (YES in S56), the state control circuit 18 sets the reset control signal S18-2 to the reset state, keeps the case control signal S18-1 at 1, and controls the filter-order deciding circuit 19 to reduce the filter order (S58). Consequently, the skew correction shifts to Step 3. In response to the control for reducing the filter order, the coefficient calculating circuit 6 sets the coefficient to the multipliers 12 at both the ends of the adaptive filter 7 to zero.

As in Step 2, according to the magnitude and the polarity of the average value dt(n) of the skew error, the coefficient calculating circuit 6 calculates the necessary phase shift amount (delay amount) FD, calculates the coefficient S6 using the sinc function, and sets the coefficient S6 in the multipliers 12 of the taps of the adaptive filter 7 (S59). Step S59 is repeated while the average dt(n) of the skew error does not decrease to zero (NO in S60) and the absolute value of the average dt(n) does not reach the maximum MAX or FD does not reach to the maximum (No in S61).

When the absolute value of the average dt(n) of the skew error reaches the maximum value MAX or FD reaches to the maximum (YES in S61), in response to a detection signal of the comparator 17 or the coefficient calculator 6, the state control circuit 18 sets the reset control signal S18-2 to the reset state again, performs control for reducing the order of the adaptive filter 7 (S58), and repeats the control in Step 2 in the same manner. Then, when the average dt(n) of the skew error is appropriately suppressed, the state control circuit 18 ends the skew correction.

According to the skew correction control, even when the frequency fin of the input signal is larger than the frequency f1 at the zero-cross point or between the frequencies f2 and f1, the skew correction circuit 20 appropriately sets the coefficient of the adaptive filter 7, controls the order to an appropriate level, and performs the skew correction.

Time Interleave ADC in a Second Embodiment

Figure 21:
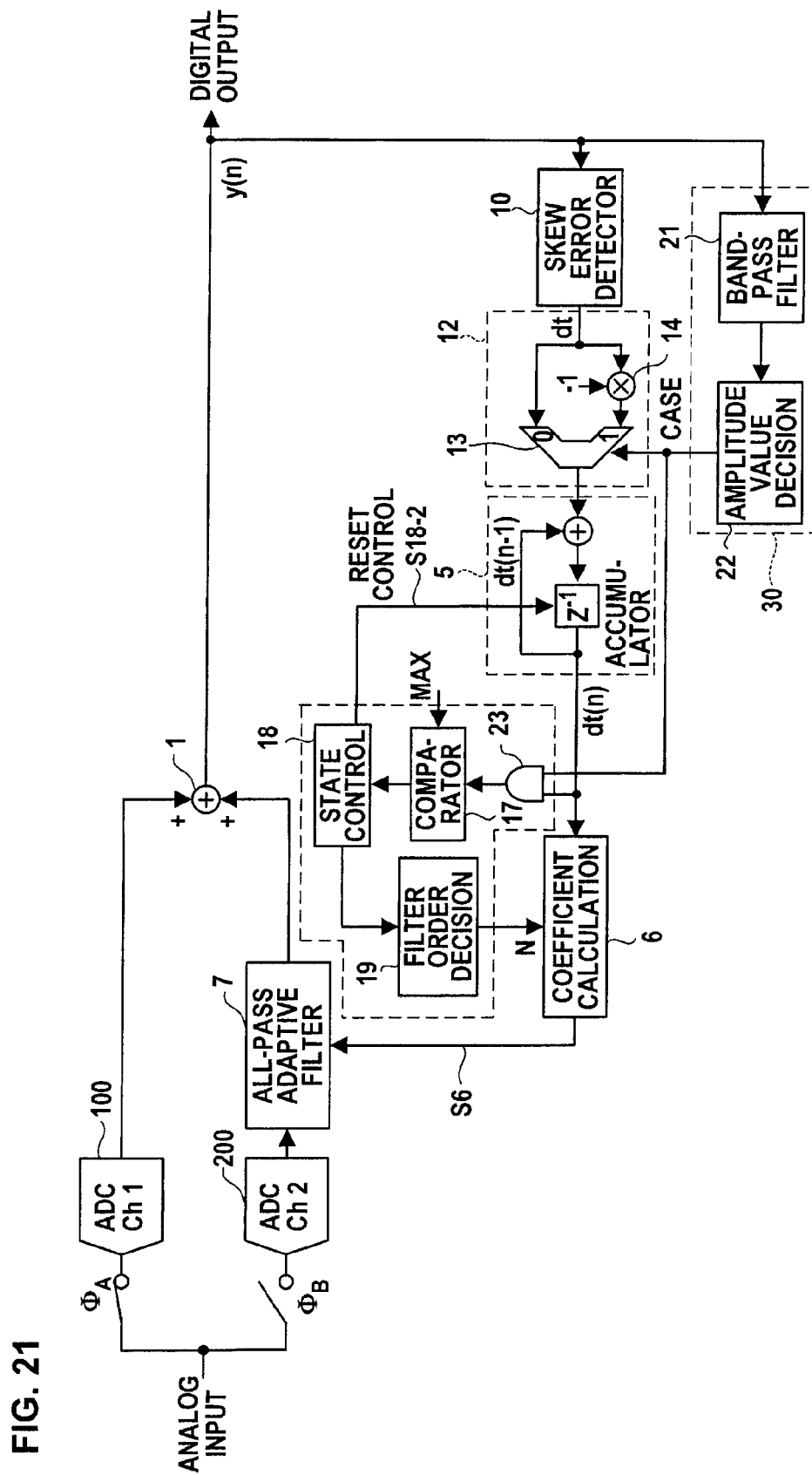
FIG. 21 is a configuration diagram of a time interleave ADC in a second embodiment.

FIG. 21 is a configuration diagram of a time interleave ADC in a second embodiment. As components different from the components illustrated in FIG. 19, the time interleave ADC additionally includes a case-control-signal generating circuit 30 including a band-pass filter 21 and an amplitude determining circuit 22 and configured to supply a case control signal to the multiplexer 13 of the polarity inverting circuit 12 and an AND gate 23 configured to input the average dt(n) of the skew error to the comparator 17 when the case control signal is 1.

The case-control-signal generating circuit 30 determine, on the basis of a frequency of the combined digital output signal y(n), whether skew correction control of a case 1 is performed or the polarity of the skew error dt is inverted and skew correction control in cases 2 and 3 is performed. In other words, the case-control-signal generating circuit 30 determines whether the frequency fin of the input signal included in the combined digital output signal y(n) is in the relation of f2<fin in FIGS. 17 and 18.

The band-pass filter 21 is a low-pass filter that allows a frequency lower than the frequency f2 to pass, therefore, fin<f2 is determined when the amplitude of an output of the filter 21 is larger than a reference value, and the case control signal is set to 0 so that the polarity inverting circuit 12 does not invert the polarity. In this case, only Step 1 of the skew correction control is executed. On the other hand, when the amplitude of the output of the filter 21 is smaller than the reference value, it is determined that f2<fin, and the polarity inverting circuit 12 inverts the polarity. In this case, Steps 2 and 3 of the skew correction control are executed. The comparator 17 determines switching from Step 2 to Step 3. Therefore, the AND gate 23 inputs the average dt(n) of the skew error to the comparator 17 only when the case control signal is 1.

The case-control-signal generating circuit 30 may receive an output of the ADC channel 100 or 200.

Figure 22:
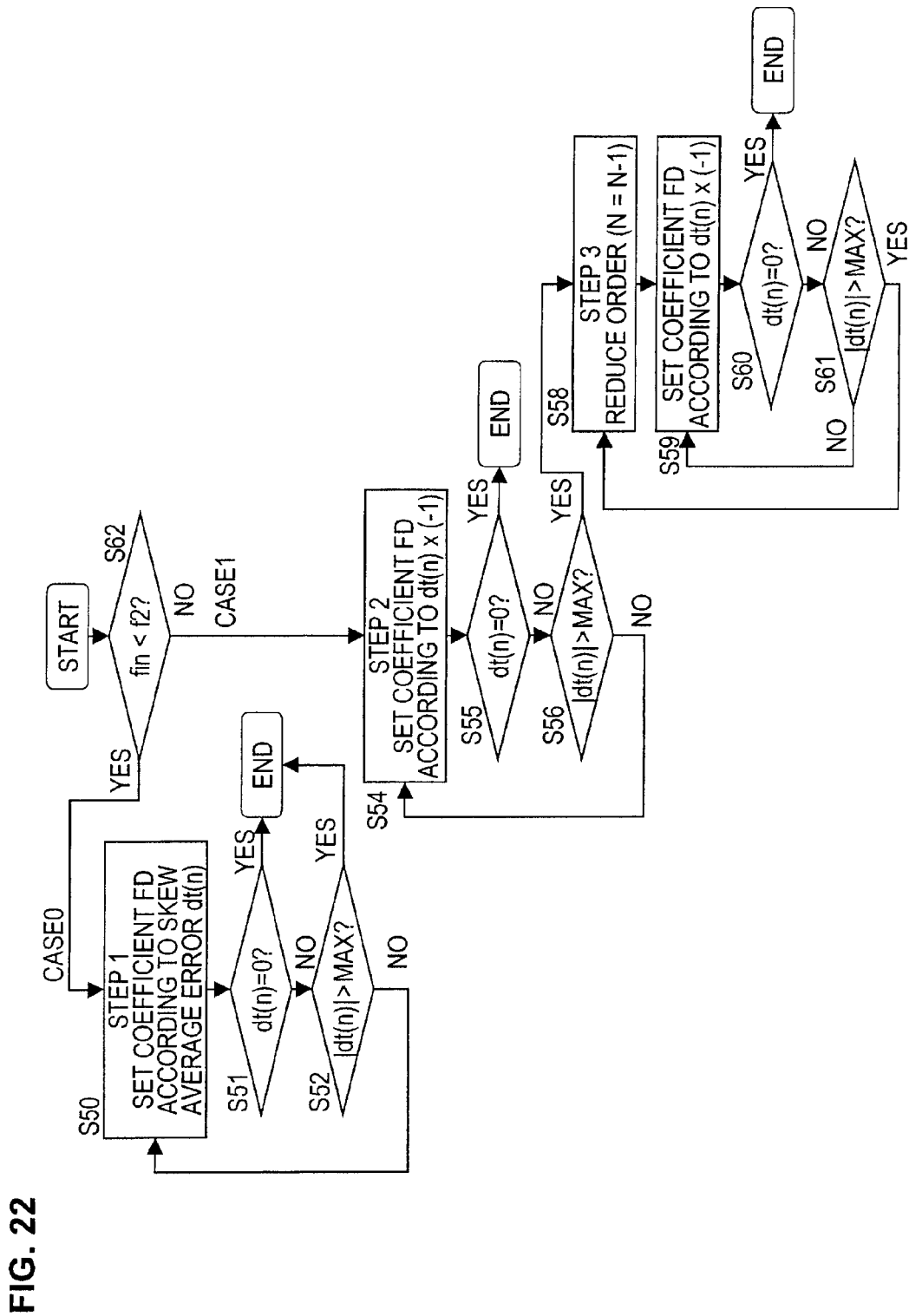
FIG. 22 is a flowchart for explaining the operation of the skew correction circuit 20 of the time interleave ADC illustrated in FIG. 21.

FIG. 22 is a flowchart for explaining the operation of the skew correction circuit 20 of the time interleave ADC illustrated in FIG. 21. In skew correction of the skew correction circuit 20, the skew correction circuit 20 performs control in Step 1 (S50 to S52) or performs control Steps 2 and 3 (S54 to S61) according to a case control signal of the case-control-signal generating circuit 30 (S62). Therefore, unlike the operation flowchart of FIG. 20 in the first embodiment, the skew correction circuit 20 does not perform Steps 1, 2, and 3 in order but performs Step 1 or performs Steps 2 and 3. Therefore, it is possible to set the skew correction process shorter than the skew correction process in the first embodiment.

In the second embodiment, the skew correction control in Steps 1, 2, and 3 is the same as the skew correction control in the first embodiment.

As explained above, with the time interleave ADC in this embodiment, even when the frequency fin of the input signal is high, it is possible to appropriately perform the skew correction control.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An analog digital converter (hereinafter ADC) that samples an analog input signal at a sampling frequency and converts the analog input signal into a digital output signal, the ADC comprising:
   a plurality of ADC channels configured to convert the analog input signal into the digital output signal in a time interleave manner;
   a channel combiner configured to combine channel digital signals respectively output by the plurality of ADC channels and generate the digital output signal;
   an adaptive filter provided between an output of at least one of the plurality of ADC channels and the channel combiner; and
   a correction circuit configured to detect a skew error included in the digital output signal, generate a coefficient of the adaptive filter according to the skew error, and set the coefficient in the adaptive filter, wherein
   in a first setting, the correction circuit sets, according to the skew error, the coefficient such that the adaptive filter phase-shifts to one direction for advancing or delaying a phase of the channel digital signal and, in a second setting, the correction circuit sets, according to the skew error, the coefficient such that the adaptive filter phase-shifts to an opposite direction to the one direction and sets, in the adaptive filter, a coefficient with which the skew error is suppressed to a desired level.

2. The ADC according to claim 1, wherein the correction circuit sets the coefficient in the second setting when a phase shift amount corresponding to the coefficient reaches an upper limit value in the first setting.

3. The ADC according to claim 2, wherein, when the phase shift amount corresponding to the coefficient reaches the upper limit value in the second setting, the correction circuit further performs, until the skew error is controlled to the desired level, a third setting for performing the setting of the coefficient by the second setting after reducing an order of the adaptive filter.

4. The ADC according to claim 1, wherein the correction circuit performs the setting of the coefficient by the first setting when a frequency of the channel digital signal or the digital output signal is lower than a reference frequency and performs the setting of the coefficient by the second setting when the frequency of the channel digital signal or the digital output signal is equal to or higher than the reference frequency.

5. The ADC according to claim 4, wherein, when a phase shift amount corresponding to the coefficient reaches the upper limit value in the second setting, the correction circuit further performs, until the skew error is controlled to the desired level, a third setting for performing the setting of the coefficient by the second setting after reducing an order of the adaptive filter.

6. The ADC according to claims 1, wherein
   the adaptive filter includes a plurality of delay latch circuits configured to sequentially latch the channel digital signal in synchronization with a clock, a plurality of multipliers configured to respectively multiply signals of inputs or outputs of the plurality of delay latch circuits and a coefficient, and an adder configured to adds up outputs of the multipliers, and
   the correction circuit includes a coefficient calculating circuit configured to generate, on the basis of a sinc function, a plurality of coefficients input to the plurality of multipliers.

7. The ADC according to claim 6, wherein the coefficient calculating circuit generates the plurality of coefficients so as to shift a phase of the sinc function according to the phase shift amount.

8. The ADC according to claim 6, wherein the coefficient calculating circuit sets a part of the plurality of coefficients to zero to reduce an order of the adaptive filter.

9. The ADC according to claim 6, wherein
   the correction circuit includes a skew-error detecting circuit configured to detect a skew error included in the digital output signal, and
   the coefficient calculating circuit determines a direction of the phase shift according to polarity of the skew error and determines an amount of the phase shift according to magnitude of the skew error.

10. The ADC according to claim 9, wherein the correction circuit further includes a state control circuit configured to monitor the skew error and control transition among the plurality of settings.

11. A correction circuit for an analog digital converter (hereinafter ADC) that samples an analog input signal at a sampling frequency and converts the analog input signal into a digital output signal, the ADC having a plurality of ADC channels configured to convert the analog input signal into the digital output signal in a time interleave manner; a channel combiner configured to combine channel digital signals respectively output by the plurality of ADC channels and generate the digital output signal; and an adaptive filter provided between an output of at least one of the plurality of ADC channels and the channel combiner, the correction circuit comprising: a skew-error detecting circuit configured to detect a skew error included in the digital output signal; and a coefficient calculating circuit configured to generate a coefficient of the adaptive filter according to the skew error and sets the coefficient in the adaptive filter, wherein in a first setting, the coefficient calculating circuit sets, according to the skew error, the coefficient such that the adaptive filter phase-shifts to one direction for advancing or delaying a phase of the channel digital signal and, in a second setting, the coefficient calculating circuit sets, according to the skew error, the coefficient such that the adaptive filter phase-shifts to an opposite direction to the one direction and sets, in the adaptive filter, a coefficient with which the skew error is suppressed to a desired level.

12. The correction circuit for the ADC according to claim 11, wherein the coefficient calculating circuit sets the coefficient in the second setting when a phase shift amount corresponding to the coefficient reaches an upper limit value in the first setting.

13. The correction circuit for the ADC according to claim 12, wherein, when the phase shift amount corresponding to the coefficient reaches the upper limit value in the second setting, the coefficient calculating circuit further performs, until the skew error is controlled to the desired level, a third step for performing the setting of the coefficient by the second setting after reducing an order of the adaptive filter.

14. The correction circuit for the ADC according to claim 11, wherein the coefficient calculating circuit performs the setting of the coefficient by the first setting when a frequency of the channel digital signal or the digital output signal is lower than a reference frequency and performs the setting of the coefficient by the second setting when the frequency of the channel digital signal or the digital output signal is equal to or higher than the reference frequency.

15. The correction circuit for the ADC according to claim 14, wherein, when a phase shift amount corresponding to the coefficient reaches the upper limit value in the second step, the coefficient calculating circuit further performs, until the skew error is controlled to the desired level, a third setting for performing the setting of the coefficient by the second setting after reducing an order of the adaptive filter.

16. The correction circuit for the ADC according to claim 11, wherein the adaptive filter includes a plurality of delay latch circuits configured to sequentially latch the channel digital signal in synchronization with a clock, a plurality of multipliers configured to respectively multiply together signals of inputs or outputs of the plurality of delay latch circuits and a coefficient, and an adder configured to adds up outputs of the multipliers, and the correction circuit includes a coefficient calculating circuit configured to generate, on the basis of a sinc function, a plurality of coefficients input to the plurality of multipliers.

17. A correction method for an analog digital converter (hereinafter ADC) that samples an analog input signal at a sampling frequency and converts the analog input signal into a digital output signal, the ADC including:

a plurality of ADC channels configured to convert the analog input signal into the digital output signal in a time interleave manner;

a channel combiner configured to combine channel digital signals respectively output by the plurality of ADC channels and generate the digital output signal; and an adaptive filter provided between an output of at least one of the plurality of ADC channels and the channel combiner, the correction method comprising:

detecting a skew error included in the digital output signal;

setting, in a first setting, according to the skew error, the coefficient in the adaptive filter such that the adaptive filter phase-shifts to one direction for advancing or delaying a phase of the channel digital signal;

setting, in a second setting, according to the skew error, the coefficient in the adaptive filter such that the adaptive filter phase-shifts to an opposite direction to the one direction; and setting, in the adaptive filter, a coefficient with which the skew error is suppressed to a desired level.

18. The correction method for the ADC according to claim 17, further comprising:

setting the coefficient in the second setting when a phase shift amount corresponding to the coefficient reaches an upper limit value in the first setting.

19. The correction method for the ADC according to claim 18, further comprising:

performing, when the phase shift amount corresponding to the coefficient reaches the upper limit value in the second setting, until the skew error is controlled to a desired level, a third setting for performing the setting of the coefficient by the second setting after reducing an order of the adaptive filter.

20. The correction method for the ADC according to claim 17, further comprising:

performing the setting of the coefficient by the first setting when a frequency of the channel digital signal or the digital output signal is lower than a reference frequency, and performing the setting of the coefficient by the second setting when the frequency of the channel digital signal or the digital output signal is equal to or higher than the reference frequency.

* * * * *